US012578889B2

(12) United States Patent
      Deutsch et al.

(10) Patent No.:  US 12,578,889 B2
(45) Date of Patent:  Mar. 17, 2026

(54) APPARATUS, DEVICE, AND METHOD FOR A MEMORY CONTROLLER, MEMORY CONTROLLER, AND SYSTEM

(71) Applicant: Intel Corporation, Santa Clara, CA (US)

(72) Inventors: Sergej Deutsch, Hillsboro, OR (US); David M. Durham, Beaverton, OR (US); Karanvir Grewal, Hillsboro, OR (US); Raghunandan Makaram, Northborough, MA (US); Rajat Agarwal, Portland, OR (US); Christoph Dobraunig, St. Veit an der Glan (AT); Krystian Matusiewicz, Gdansk (PL); Santosh Ghosh, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 160 days.

(21) Appl. No.: 18/334,262

(22) Filed: Jun. 13, 2023

(65) Prior Publication Data

US 2023/0400996 A1    Dec. 14, 2023

Related U.S. Application Data

(60) Provisional application No. 63/351,613, filed on Jun. 13, 2022.

(51) Int. Cl.
      *G06F 3/06*        (2006.01)
      *G11C 7/24*        (2006.01)

(52) U.S. Cl.
      CPC ............ *G06F 3/064* (2013.01); *G06F 3/0619* (2013.01); *G11C 7/24* (2013.01); *G06F 3/0679* (2013.01)

(58) Field of Classification Search
      CPC ...... G06F 3/064; G06F 3/0619; G06F 3/0679; G06F 11/1048; G11C 7/24; G11C 8/20; G11C 11/4078
      USPC ........................................................ 714/763
      See application file for complete search history.

(56) References Cited

U.S. PATENT DOCUMENTS

| | | | | |
|---|---|---|---|---|
| 7,398,449 B1 * | 7/2008 | Normoyle | ........... | G06F 11/1016 |
| | | | | 714/767 |
| 11,200,112 B1 * | 12/2021 | Mcilvain | ............. | G06F 11/1048 |
| 2011/0131459 A1 * | 6/2011 | Tu | ............ | G06F 21/79 |
| | | | | 713/193 |
| 2012/0182821 A1 * | 7/2012 | Perego | ................ | G06F 11/1048 |
| | | | | 365/230.01 |
| 2013/0191705 A1 * | 7/2013 | Watanabe | ........... | G06F 11/1056 |
| | | | | 714/773 |

\* cited by examiner

*Primary Examiner* — James C Kerveros
(74) *Attorney, Agent, or Firm* — 2SPL Patent Attorneys PartG mbB; Kieran O'Leary

(57) ABSTRACT

Some aspects of the present disclosure relate to an apparatus comprising interface circuitry and processor circuitry to write data bits to a memory, by applying a diffusion function on the data bits to calculate diffused data bits, calculating error correcting code (ECC) bits based on the data bits or based on the diffused data bits, applying a diffusion function on the ECC bits to calculate diffused ECC bits, storing the diffused ECC bits in an ECC portion of the memory, and storing the data bits or the diffused data bits in a data portion of the memory.

19 Claims, 17 Drawing Sheets

1000

1000

APPARATUS, DEVICE, AND METHOD FOR A MEMORY CONTROLLER, MEMORY CONTROLLER, AND SYSTEM

BACKGROUND

Row hammer (RH) attacks on dynamic random-access memory (DRAM) are a threat for cloud service providers, despite numerous mitigation techniques proposed in the recent past. A RH attack exploits an undesirable effect of cross talk between adjacent memory cells in DRAM, allowing an adversary to change a victim's memory content in a particular row by repeatedly accessing ("hammering") data at a different row which is physically adjacent to victim's memory. A RH exploit can be used for privilege escalation by malicious actors. Current RH mitigation techniques are ineffective or are impractical due to significant performance/storage overhead.

A Row hammer adversary is a software only adversary that can change the data stored in adjacent memory cells, and hence the data used by other unprivileged or privileged processes like the operating system (OS). Due to the deterministic nature of error correction codes (ECC), ECC-DRAM is also affected.

BRIEF DESCRIPTION OF THE FIGURES

Some examples of apparatuses and/or methods will be described in the following by way of example only, and with reference to the accompanying figures, in which.

DETAILED DESCRIPTION

Figure 1A:
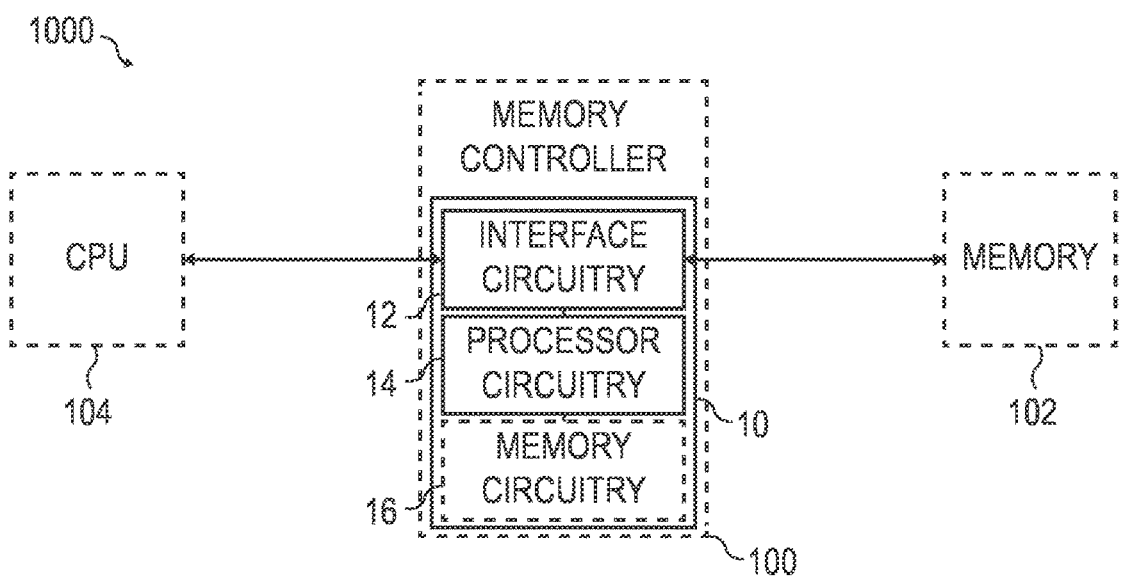
FIG. 1a shows a block diagram of an example of an apparatus or device, of a memory controller comprising such an apparatus or device, and of a system comprising a memory controller.

Some examples are now described in more detail with reference to the enclosed figures. However, other possible examples are not limited to the features of these embodiments described in detail. Other examples may include modifications of the features as well as equivalents and alternatives to the features. Furthermore, the terminology used herein to describe certain examples should not be restrictive of further possible examples.

Throughout the description of the figures same or similar reference numerals refer to same or similar elements and/or features, which may be identical or implemented in a modified form while providing the same or a similar function. The thickness of lines, layers and/or areas in the figures may also be exaggerated for clarification.

When two elements A and B are combined using an "or", this is to be understood as disclosing all possible combinations, i.e., only A, only B as well as A and B, unless expressly defined otherwise in the individual case. As an alternative wording for the same combinations, "at least one of A and B" or "A and/or B" may be used. This applies equivalently to combinations of more than two elements.

If a singular form, such as "a", "an" and "the" is used and the use of only a single element is not defined as mandatory either explicitly or implicitly, further examples may also use several elements to implement the same function. If a function is described below as implemented using multiple elements, further examples may implement the same function using a single element or a single processing entity. It is further understood that the terms "include", "including", "comprise" and/or "comprising", when used, describe the presence of the specified features, integers, steps, operations, processes, elements, components and/or a group thereof, but do not exclude the presence or addition of one or more other features, integers, steps, operations, processes, elements, components and/or a group thereof.

In the following description, specific details are set forth, but examples of the technologies described herein may be practiced without these specific details. Well-known circuits, structures, and techniques have not been shown in detail to avoid obscuring an understanding of this description. "An example/example," "various examples/examples," "some examples/examples," and the like may include features, structures, or characteristics, but not every example necessarily includes the particular features, structures, or characteristics.

Some examples may have some, all, or none of the features described for other examples. "First," "second," "third," and the like describe a common element and indicate different instances of like elements being referred to. Such adjectives do not imply element item so described must be in a given sequence, either temporally or spatially, in ranking, or any other manner. "Connected" may indicate elements are in direct physical or electrical contact with each other and "coupled" may indicate elements co-operate or interact with each other, but they may or may not be in direct physical or electrical contact.

As used herein, the terms "operating", "executing", or "running" as they pertain to software or firmware in relation to a system, device, platform, or resource are used interchangeably and can refer to software or firmware stored in one or more computer-readable storage media accessible by the system, device, platform, or resource, even though the instructions contained in the software or firmware are not actively being executed by the system, device, platform, or resource.

The description may use the phrases "in an example/ example," "in examples/examples," "in some examples/ examples," and/or "in various examples/examples," each of which may refer to one or more of the same or different examples. Furthermore, the terms "comprising," "including," "having," and the like, as used with respect to examples of the present disclosure, are synonymous.

This disclosure relates generally to security in computing systems, and more particularly, to deterring row hammer attacks against computing systems.

FIG. 1a shows a block diagram of an example of an apparatus 10 or device 10. For example, the apparatus 10 of FIG. 1a comprises interface circuitry 12 and processor circuitry 14. For example, the processor circuitry 14 may be coupled with the interface circuitry 12. For example, the processor circuitry 14 may provide the functionality of the apparatus, in conjunction with the interface circuitry 12 (for exchanging information, e.g., with other components inside or outside the memory controller 100 comprising the apparatus 10 or device 10, such as a memory 102 or a Central Processing Unit 104). In some examples, the processor circuitry may further comprise memory circuitry 16 for storing information, such as diffusion keys being used to perform the diffusion function, with the memory circuitry 16 being coupled to the processor circuitry 14. For example, the memory circuitry 16 may include volatile memory and/or non-volatile memory. Likewise, the device 10 may comprise means for providing the functionality of the device 10. For example, the means may be configured to provide the functionality of the device 10. The components of the device 10 are defined as component means, which may correspond to, or implemented by, the respective structural components of the apparatus 10. For example, the device 10 of FIG. 1a comprises means for processing 14, which may correspond to or be implemented by the processor circuitry 14, means for communicating 12, which may correspond to or be implemented by the interface circuitry 12, and (optional) memory 16, which may correspond to or be implemented by the memory circuitry 16. In some examples, the functionality of the processor circuitry 14 or means for processing 14 may be implemented by the processor circuitry 14 or means for processing 14 executing machine-readable instructions. Accordingly, any feature ascribed to the processor circuitry 14 or means for processing 14 may be defined by one or more instructions of a plurality of machine-readable instructions. The apparatus 10 or device 10 may comprise the machine-readable instructions, e.g., within the memory circuitry 16.

FIG. 1a further shows a memory controller 100 comprising the apparatus 10 or device 10. The memory controller 100 may further be part of a system 1000, which may be a computer system, comprising the memory controller 100, a Central Processing Unit (CPU) 104 and the memory 102. For example, the memory controller 100 may be part of the Central Processing Unit 104. Alternatively, the memory controller 100 may be separate from the Central Processing Unit 104.

Figure 1B:
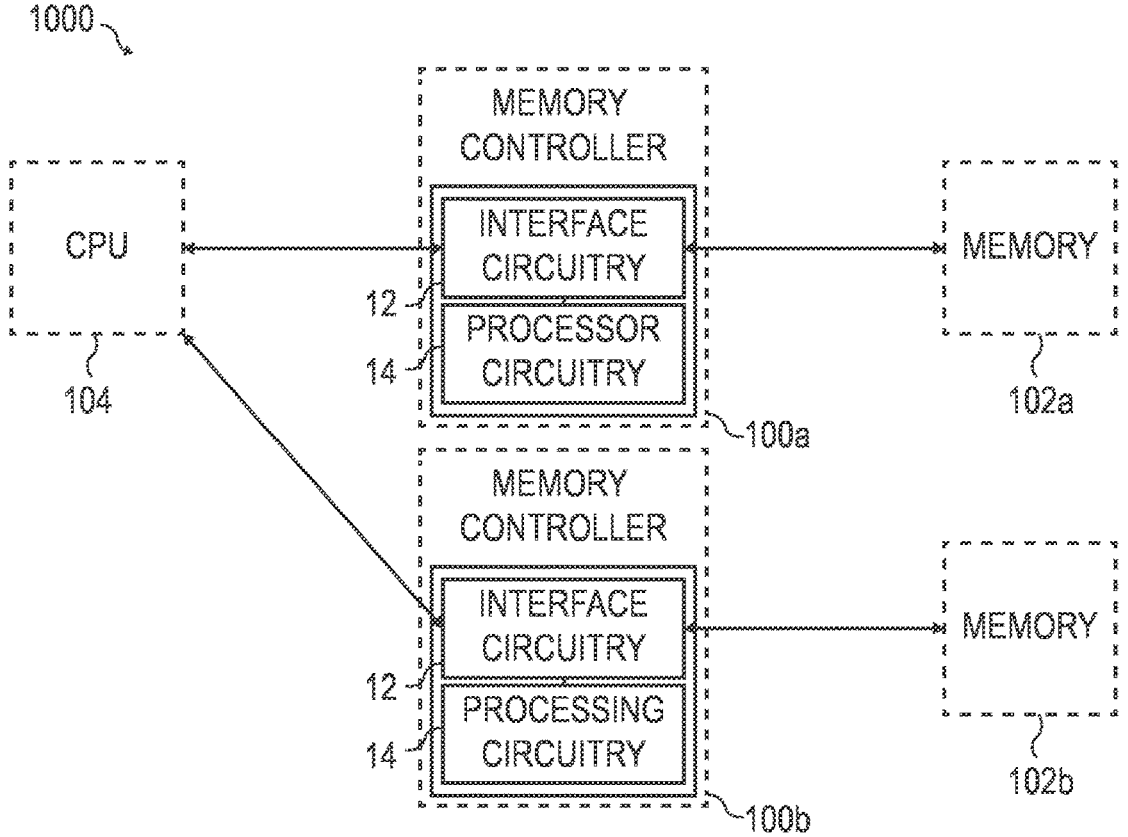
FIG. 1b shows a block diagram of an example of a system comprising two memory controllers.

In some cases, a (computer) system 1000, and in particular a CPU 104, may comprise more than one memory controller 100. FIG. 1b shows a block diagram of an example of a system comprising two memory controllers, for example.

In the following, two modes of operation of the apparatus 10, device 10, and of a corresponding method are introduced—a write operation, which corresponds to a write flow in case of the method, and a read operation, which corresponds to a read flow in case of the method. In some cases, the respective apparatus, device and/or method may perform both the write operation/write flow and the read operation/ read flow. In some cases, the respective apparatus, device and/or method may perform only one of the two operations/ flows.

The following description starts with the write operation/ write flow.

In some examples, when the apparatus is used to write data to memory, the processor circuitry 14 or means for processing 14 writes data bits to a memory 102. For example, the data bits may be data bits of a cache line of a processor, such as the CPU 104 shown in FIGS. 1a and 1b. The act of writing data bits to memory comprises applying a diffusion function on the data bits to calculate diffused data bits. The act of writing data bits to memory comprises calculating error correcting code (ECC) bits based on the data bits or based on the diffused data bits. The act of writing data bits to memory comprises applying a diffusion function on the ECC bits to calculate diffused ECC bits. The act of writing data bits to memory comprises storing the diffused ECC bits in an ECC portion of the memory. The act of writing data bits to memory comprises storing the data bits or the diffused data bits in a data portion of the memory.

Figure 1C:
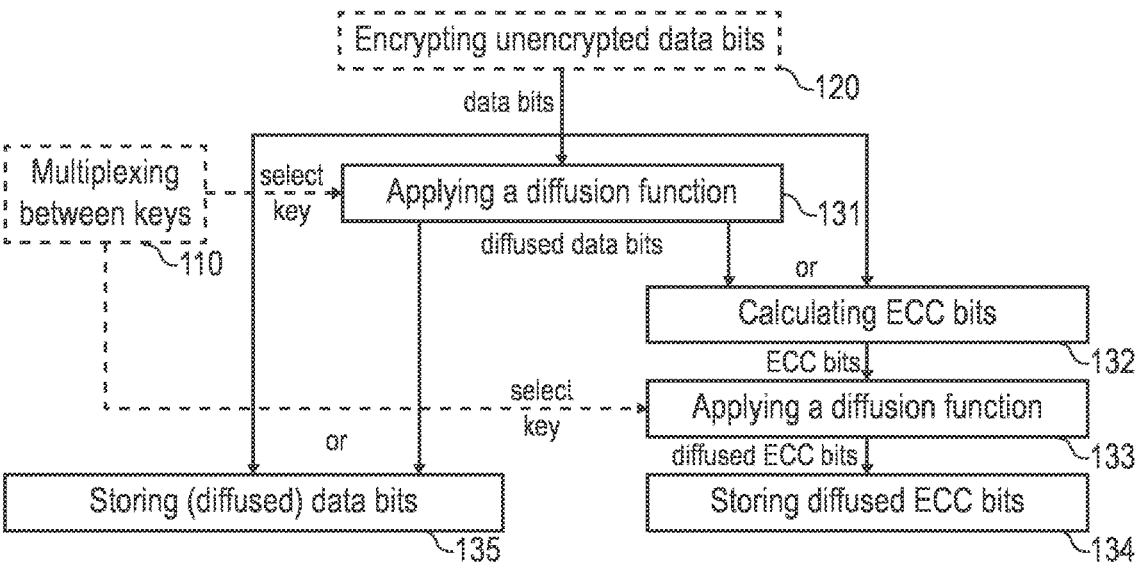
FIG. 1c shows a flow chart of an example of a write flow portion of a method.

FIG. 1c shows a flow chart of an example of a write flow portion of a method. The write flow portion of the method comprises writing the data bits to the memory 102. The act of writing the data bits to memory comprises applying 131 a diffusion function on the data bits to calculate the diffused data bits. The act of writing data bits to memory comprises calculating 132 the ECC bits based on the data bits or based on the diffused data bits. The act of writing data bits to memory comprises applying 133 a diffusion function on the ECC bits to calculate the diffused ECC bits. The act of writing data bits to memory comprises storing 134 the diffused ECC bits in an ECC portion of the memory. The act of writing data bits to memory comprises storing 135 the data bits or the diffused data bits in the data portion of the memory.

In the following, the features of the apparatus 10, of the device 10 and of the corresponding method are explained in more detail with respect to the apparatus 10. Any feature introduced in connection with the apparatus 10 may likewise be applied to the corresponding device 10 and method.

Various examples of the present disclosure relate to techniques for mitigating Rowhammer-like attacks in computer system. Rowhammer attacks exploit an undesirable effect of cross talk between adjacent memory cells in Dynamic Random Access Memory (DRAM), allowing an adversary to change a victim's memory content in a particular row by repeatedly accessing ("hammering") data at a different row which is physically adjacent to victim's memory. A Rowhammer exploit can be used for privilege escalation by malicious actors. A Rowhammer adversary is a software only adversary that can change the data stored in adjacent memory cells, and hence the data used by other unprivileged or privileged processes like the OS. To mitigate Rowhammer attacks, various techniques were proposed, such as adding cryptographic authentication via a message authentication code (MAC), Message Authentication Galois Integrity and Correction (MAGIC) with 64/128-bit blocks providing simultaneous data authentication and error correction, and ECC. While the former two mitigations are difficult to implement and often also include a performance overhead, due to the deterministic nature of ECC, also ECC-DRAM is also affected by some types of Rowhammer attacks, as it can be bypassed by inducing targeted errors that are undetected or miscorrected by the ECC algorithm.

In the proposed concept, an additional "diffusion layer" is introduced on top of the ECC algorithm. Using this additional diffusion, an additional transformation is introduced, which is hard for an attacker to predict, and which makes attacking the ECC bits harder. In the proposed concept, at least some of the bits are diffused before being written to memory, which makes attacking the ECC algorithm infeasible.

The proposed concept is based on a diffusion function (which is also referred to as "blinding function"), which is used to diffuse the data bits and/or the ECC bits during the write operation. In this context, a diffusion function is a function that diffuses a pre-defined number of bits, by transforming a bit-vector of a given length into a different bit-vector having the same (or a different length). For example, the diffusion function may be used to transform blocks of bits (e.g., 8-bit blocks, 16-bit blocks, 32-bit blocks, 64-bit blocks, 128-bit blocks etc.) into different blocks of bits having the same size, e.g., by transforming k n-bit blocks of bits into k different n-bit blocks of bits. Accordingly, the diffusion function may be a block-wise function. During the corresponding read operation, the diffusion is reversed, by applying the corresponding inverse diffusion function. Thus, the function being used to perform the diffusion, and the corresponding inverse diffusion needs to be reversible, so the original bits (or blocks of bits) can be reconstructed. In mathematical terms, the function may be a (block-wise) bijective function, i.e., a function that allows projecting of a value (e.g., a bit vector) from a first space (e.g., the origin space) to a second space (e.g., the diffusion/ diffused space) and back. Accordingly, the diffusion function, and the corresponding inverse diffusion function, may be a bijective function.

Figure 4A:
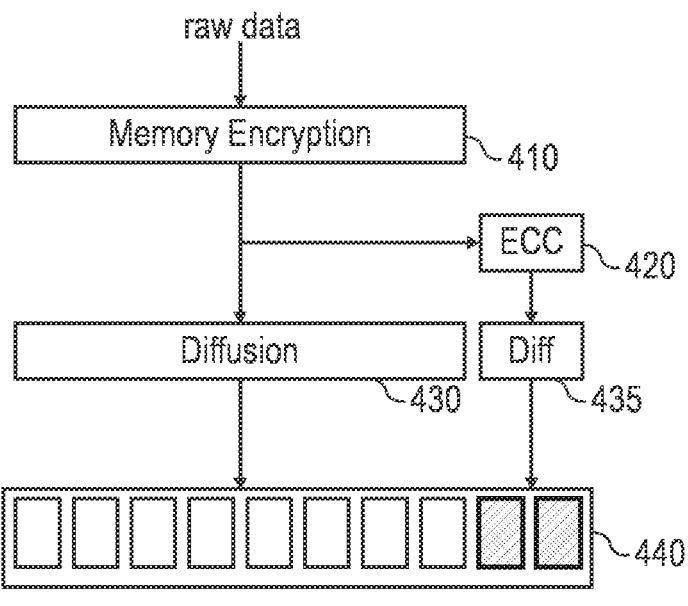
FIG. 4a illustrates a write operation in a first example.
Figure 4B:
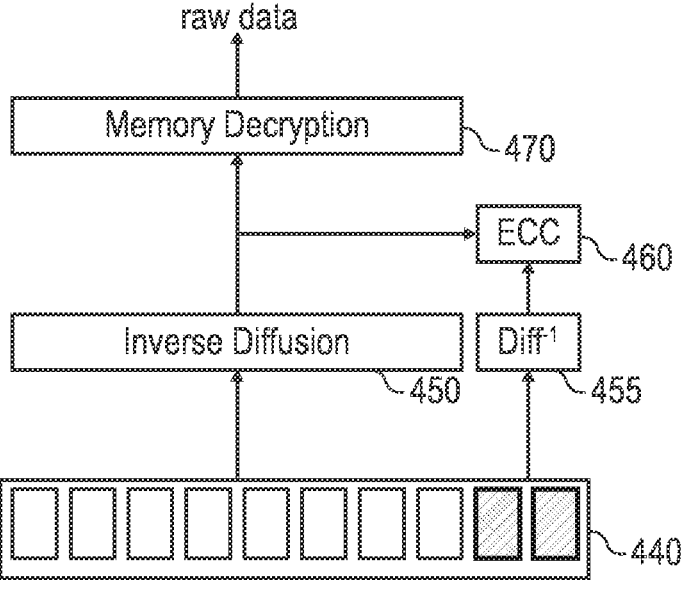
FIG. 4b illustrates a read operation in a first example.
Figures 4C, 4D:
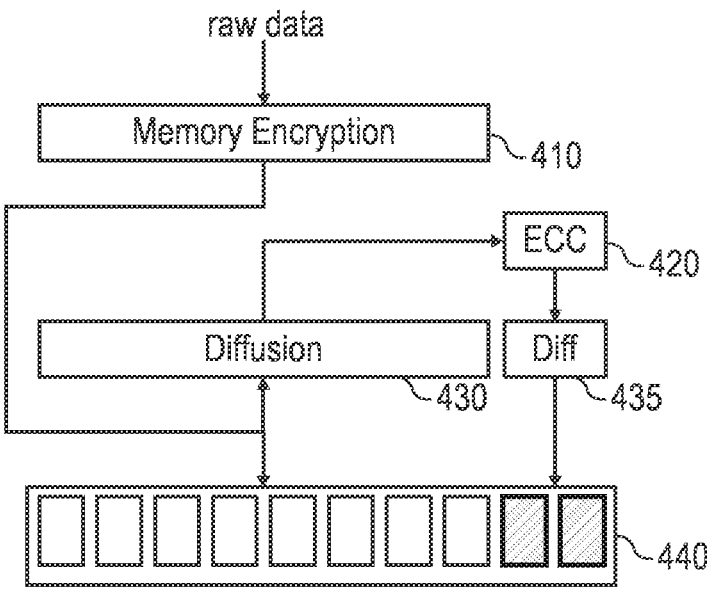
FIG. 4c illustrates a write operation in a second example.
FIG. 4d illustrates a read operation in a second example.
Figure 7:
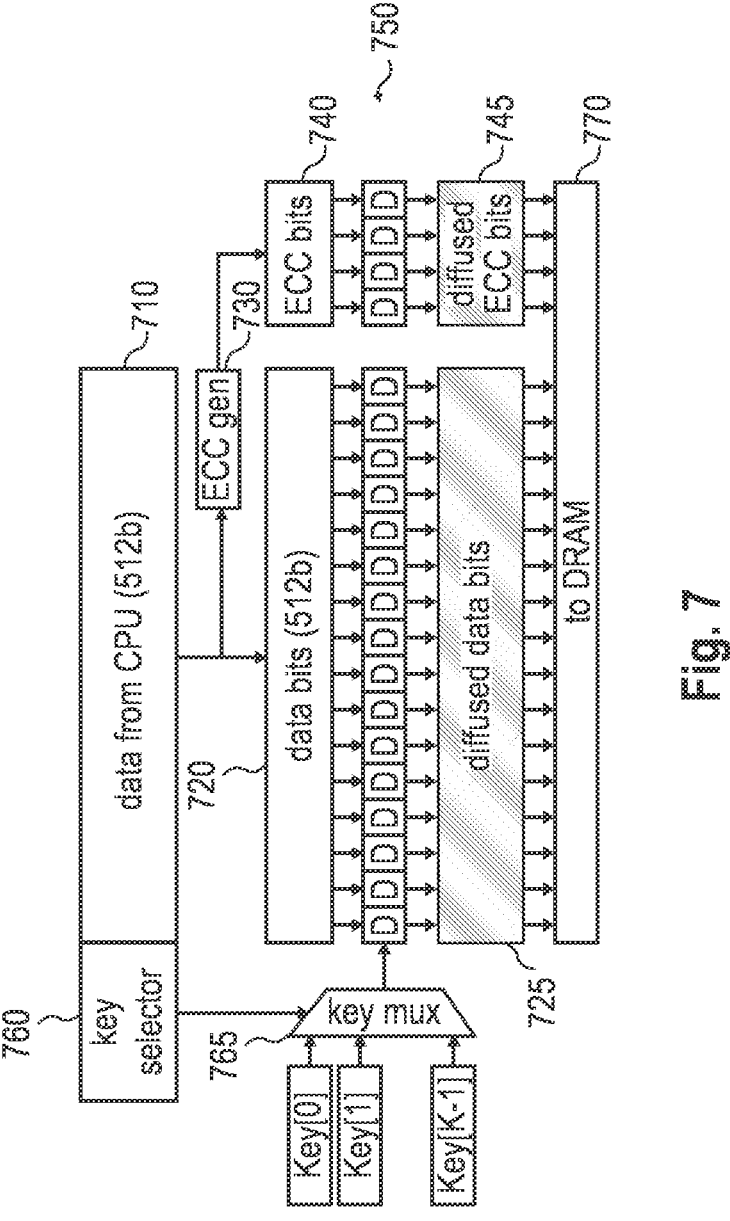
FIG. 7 shows a write flow of a variation of a first example.
Figure 8:
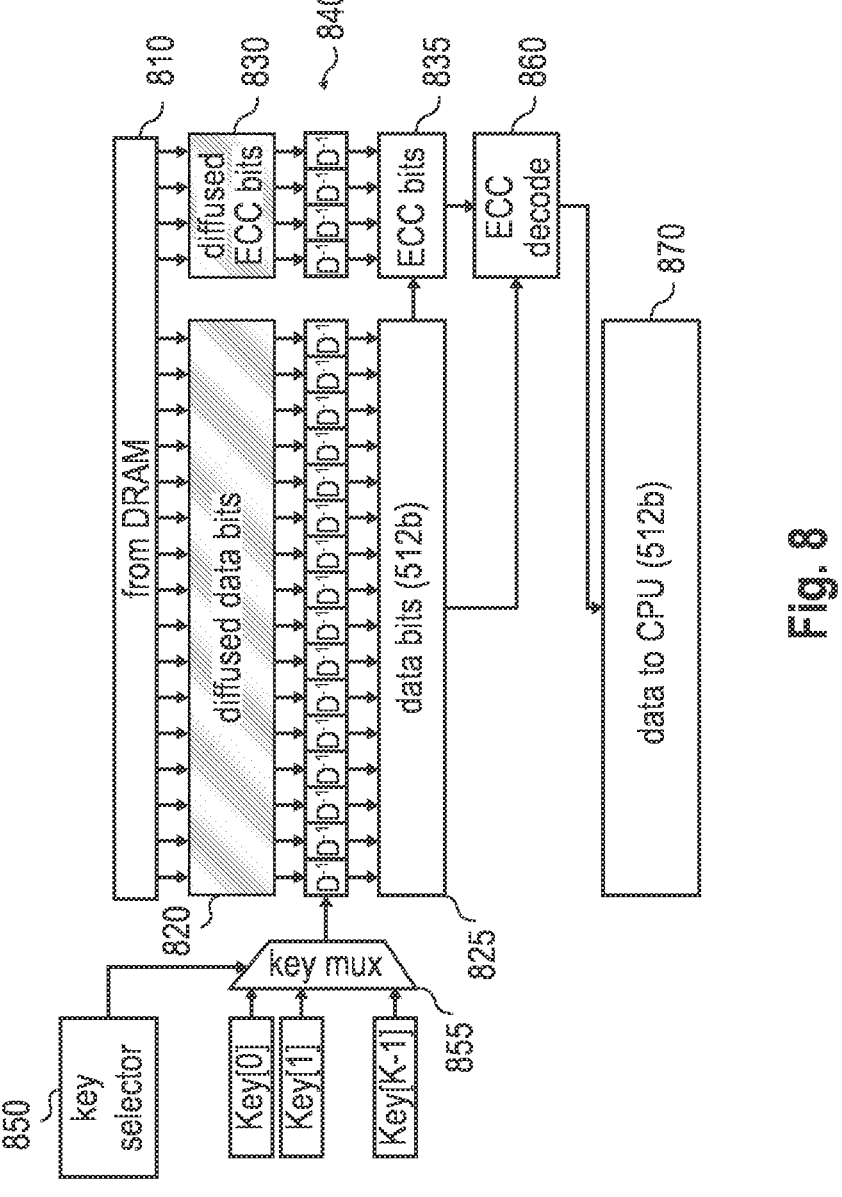
FIG. 8 shows a read flow of a variation of a first example.

In the proposed concept, the diffusion function may be applied at different points. This is best illustrated in connection with FIGS. 4a to 4d, of which FIG. 4a illustrates a write operation according to a first example, FIG. 4b illustrates a corresponding read operation according to the first example, FIG. 4c illustrates a write operation according to a second example, and FIG. 4d illustrates a corresponding read operation according to the second example. FIGS. 7 and 8 illustrate an extension of the first example, and FIGS. 9a and 9b illustrate an extension of the second example.

In the first example, illustrated in FIG. 4a and FIG. 7, the ECC bits are calculated by ECC circuitry 420 based on the data bits (which are encrypted data bits that are encrypted by memory encryption circuitry 410 in the example of FIGS. 4a to 4d, with the encryption being optional with respect to the proposed concept), and both the (encrypted) data bits and the ECC bits are diffused by diffusion circuitry 430 and diffusion circuitry 435, respectively, before being stored in memory 440. In other words, the data bits may be encrypted data bits, with the processor circuitry encrypting unencrypted data bits (which may, however, contain encrypted information) to obtain the (encrypted) data bits. For this purpose, the processor circuitry may comprise memory encryption circuitry, such as the memory encryption circuitry 410 shown in FIGS. 4a and 4c. Correspondingly, the method may comprise encrypting 120 unencrypted data bits to obtain the data bits. The processor circuitry may write the (encrypted) data bits to the memory 102, by applying the diffusion function on the data bits to calculate diffused data bits, calculating the ECC bits based on the data bits, applying the diffusion function on the ECC bits to calculate diffused ECC bits, storing the diffused ECC bits in an ECC portion of the memory, and storing the diffused data bits in the data portion of the memory.

Figure 9A:
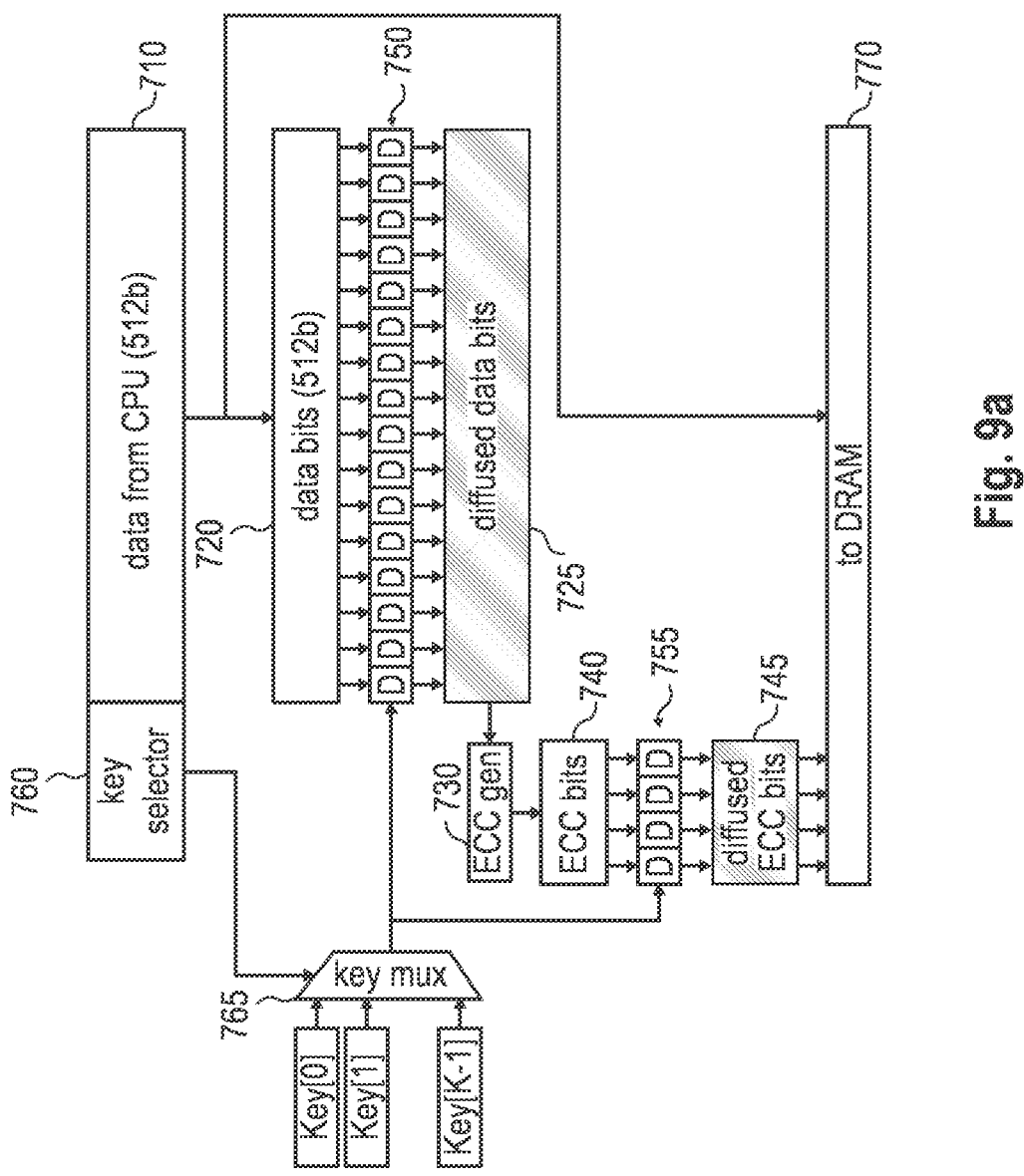
FIG. 9a shows a write flow of a variation of a second example.
Figure 9B:
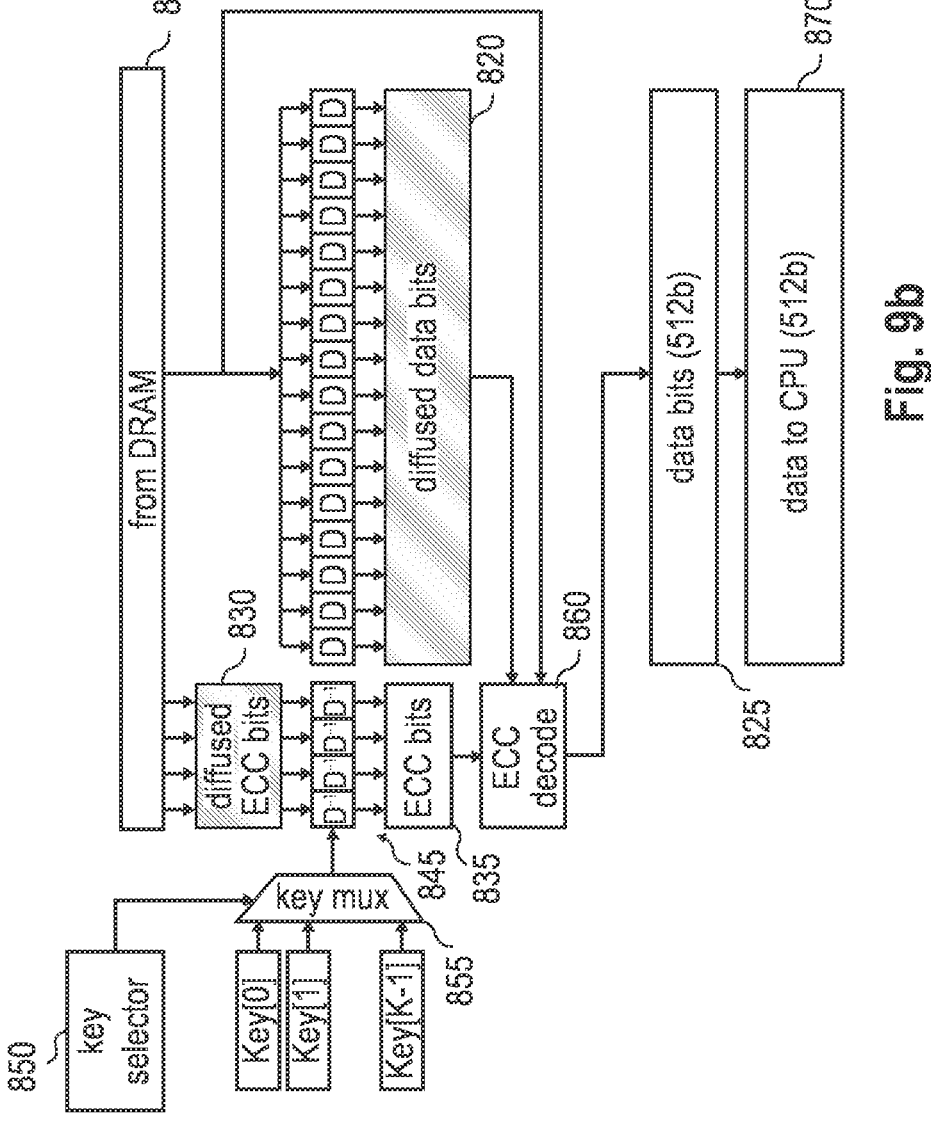
FIG. 9b shows a read flow of a variation of a second example.

In the second example, illustrated in FIG. 4c and FIG. 9a, both the (encrypted) data bits and the ECC bits are diffused by diffusion circuitry 430 and diffusion circuitry 435, respectively. However, in the second example, the ECC bits are calculated on the diffused data bits before being stored in the ECC portion of the memory, and the data bits (and not the diffused data bits) are stored in the data portion of the memory. In other words, the processor circuitry may encrypt unencrypted data bits to obtain the encrypted data bits. The processor circuitry may write the (encrypted) data bits to memory, by applying the diffusion function on the data bits to calculate the diffused data bits, calculating the ECC bits based on the diffused data bits, applying the diffusion function on the ECC bits to calculate the diffused ECC bits, storing the diffused ECC bits in the ECC portion of the memory, and storing the data bits in the data portion of the memory.

While the write operation of the second example may take more time than the write operation of the first example, it may provide improved performance during the read operation, as memory decryption can be performed (speculatively) without going through the diffusion function, which may decrease the read delay. On the other hand, the first example provides an improved write performance. The respective methodology being applied may be chosen according to whether read or write performance is being prioritized.

In the following, the read operation/read flow is introduced.

For example, processor circuitry 14 may read data bits from the data portion of the memory 102. The act of reading the data bits from the data portion of the memory comprises reading diffused ECC bits from the ECC portion of the memory. The act of reading the data bits from the data portion of the memory comprises applying an inverse diffusion function on the diffused ECC bits to obtain ECC bits. The act of reading the data bits from the data portion of the memory comprises obtaining diffused data bits. The act of reading the data bits from the data portion of the memory comprises determining, whether ECC error correction is necessary on the diffused data bits using the ECC bits. The act of reading the data bits from the data portion of the memory comprises, in case ECC error correction is necessary, performing ECC error correction on the diffused data bits and applying the inverse diffusion function on the ECC error-corrected diffused data bits to calculate ECC error corrected data bits. The act of reading the data bits from the data portion of the memory comprises providing the data bits or the ECC error corrected data bits.

Figure 1D:
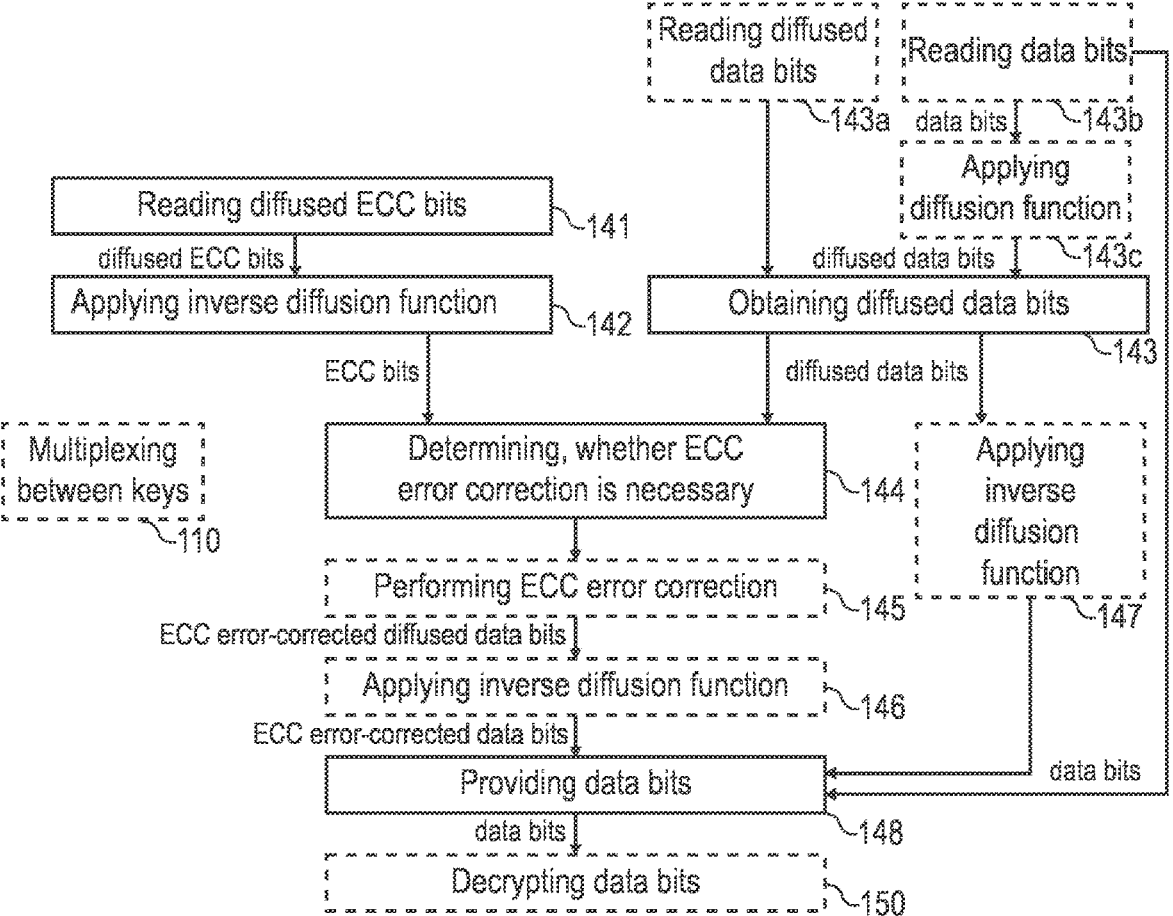
FIG. 1d shows a flow chart of an example of a read flow portion of a method.

FIG. 1d shows a flow chart of an example of a corresponding read flow portion of the method. The method may comprise reading 141-148 data bits from the data portion of a memory. Again, the act of reading the data bits form the data portion of the memory comprises reading 141 diffused ECC bits from the ECC portion of the memory. The act of reading the data bits form the data portion of the memory comprises applying 142 an inverse diffusion function on the diffused ECC bits to obtain the ECC bits. The act of reading the data bits form the data portion of the memory comprises obtaining 143 the diffused data bits. The act of reading the data bits form the data portion of the memory comprises determining 144, whether ECC error correction is necessary on the diffused data bits using the ECC bits. The act of reading the data bits form the data portion of the memory comprises, in case ECC error correction is necessary, performing 145 the ECC error correction on the diffused data bits and applying 146 the inverse diffusion function on the ECC error-corrected diffused data bits to calculate ECC error corrected data bits. The act of reading the data bits form the data portion of the memory comprises providing 148 the data bits or the ECC error corrected data bits.

It is evident that, depending on how the data bits and ECC bits are written into the memory, different courses of action may be taken for reading out the data bits.

Reference is, again, made to the first example of FIGS. 4*b* and 8, and to the second example of FIGS. 4*d* and 9*b*.

In the first example, illustrated in FIGS. 4*b* and 8, the diffused data bits and the diffused ECC bits are read from their respective portions of the memory 440 (with the ECC portion being highlighted with a fill). Inverse diffusion functions are applied by circuitry 450, 455 for applying the inverse diffusion function. Then, the ECC check (and, potentially, recovery) is performed on the un-diffused ECC bits and un-diffused data bits by ECC circuitry 460, and the un-diffused data bits are decrypted using memory decryption circuitry 470 to provide the raw (unencrypted, undiffused) data bits. In other words, in the read operation according to the first example, the act of reading the data bits from the data portion of the memory comprises reading diffused ECC bits from the ECC portion of the memory, applying an inverse diffusion function on the diffused ECC bits to obtain ECC bits, obtaining diffused data bits by reading the diffused data bits from the data portion of the memory (operation 143*a* in the method of FIG. 1*d*), determining, whether ECC error correction is necessary on the diffused data bits using the ECC bits, in case ECC error correction is necessary, performing ECC error correction on the diffused data bits and applying the inverse diffusion function on the ECC error-corrected diffused data bits to calculate ECC error corrected data bits, and providing the data bits or the ECC error corrected data bits. In addition, as part of the read operation/flow, the processor circuitry may decrypt the (ECC error corrected) data bits to obtain decrypted data bits. Accordingly, the read flow portion of the method may comprise decrypting 150 the data bits to obtain the decrypted data bits.

In the second example, illustrated in FIGS. 4*d* and 9*b*, the data bits and the diffused ECC bits are read from their respective portions of the memory 440. An inverse diffusion function is applied on the diffused ECC bits by inversion diffusion circuitry 455, and a diffusion function is applied on the data bits by diffusion circuitry 430. Then, the ECC check (and, potentially, recovery) is performed on the un-diffused ECC bits and the diffused data bits by ECC circuitry 460, and the data bits (or ECC error corrected data bits) are decrypted using memory decryption circuitry 470 to provide the raw (unencrypted, undiffused) data bits. Accordingly, the act of reading the data bits from the data portion of the memory comprises reading the diffused ECC bits from the ECC portion of the memory, applying an inverse diffusion function on the diffused ECC bits to obtain ECC bits, obtaining diffused data bits by reading (operation 143*b* of the method of FIG. 1*d*) the data bits from the data portion of the memory, and applying (operation 143*c* of the method of FIG. 1*d*) the diffusion function on the data bits, determining, whether ECC error correction is necessary on the diffused data bits using the ECC bits, in case ECC error correction is necessary, performing ECC error correction on the diffused data bits and applying the inverse diffusion function on the ECC error-corrected diffused data bits to calculate ECC error corrected data bits, and providing the data bits or the ECC error corrected data bits. In addition, as part of the read operation/flow, the processor circuitry may decrypt the (ECC error corrected) data bits to obtain decrypted data bits. Accordingly, the read flow portion of the method may comprise decrypting 150 the data bits to obtain the decrypted data bits.

As outlined above, if memory encryption is used, in some cases, the data bits may be decrypted speculatively, i.e., while the ECC check is being performed. In other words, the processor circuitry may decrypt a first version of the data bits in parallel to determining, whether ECC error correction is necessary, and to decrypt a second version of the data bits that corresponds to the ECC error corrected data bits in case ECC error correction is necessary. If ECC error correction is not necessary (which is the predominant case), the speculatively decrypted data bits may be released. If this case, with there being no ECC error corrected data bits, the decrypting of the second version of the data bits may be foregone. If ECC error correction (and in particular recovery) is performed, the result of the decryption of the second version of the data bits may be provided instead. For example, (decrypted version of) the second version of the data bits may be provided instead of the first version if the ECC error correction is necessary. This may result in a delay. Accordingly, the second version of the data bits may be provided after the first version if the ECC error correction is necessary.

Figure 5A:
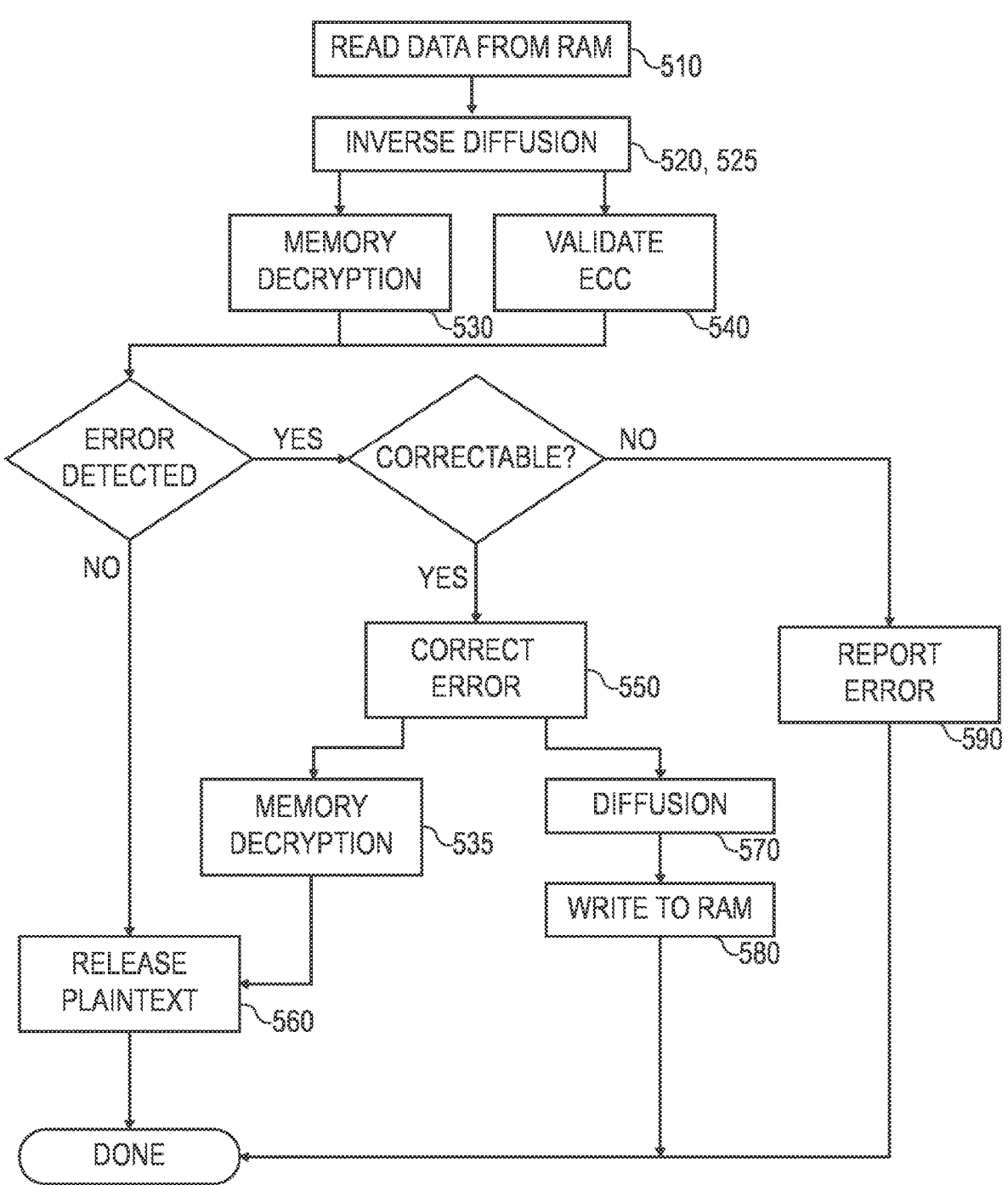
FIG. 5a is a flow diagram of data processing according to the first example.
Figure 5B:
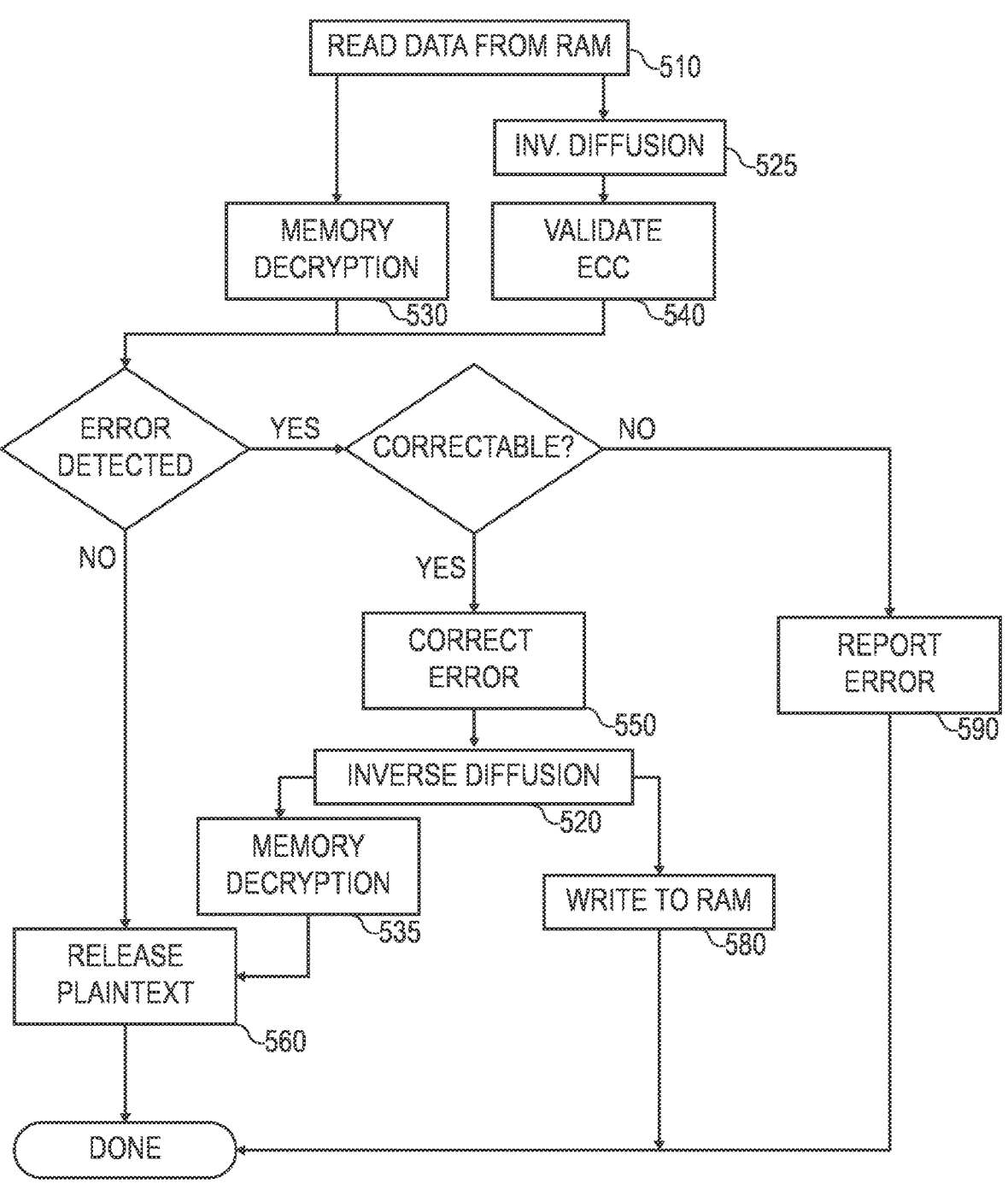
FIG. 5b is a flow diagram of data processing according to the second example.

This process is illustrated in FIGS. 5*a* and 5*b* for the first and second example discussed above. In FIG. 5*a*, speculative decryption is discussed for the read operation/read flow according to the first example. The diffused data bits and diffused ECC bits are read 510 from RAM, and inverse diffusion 520, 525 is performed on both the diffused data bits and the diffused ECC bits. Speculative memory decryption 530 is performed in parallel to ECC validation 540. If no ECC error is detected, the (speculatively) decrypted data bits are released 560 as plain text. If an ECC error is detected (that is correctable), the error is corrected 550, the error-corrected data bits are decrypted 535, and the decrypted data bits are released 560 as plain text. In addition, the error-corrected data bits are diffused 570 and written 580 to RAM.

In FIG. 5*b*, speculative decryption is discussed for the read operation/read flow according to the second example. The data bits and the diffused ECC bits are read 510 from RAM, and inverse diffusion 525 is performed on the diffused ECC bits. Speculative memory decryption 530 is performed on the data bits in parallel to inverse diffusion 525 and ECC validation 540. If no ECC error is detected, the (speculatively) decrypted data bits are released 560 as plain text. If an ECC error is detected (that is correctable), the error is corrected 550, inverse diffusion 520 is performed on the error-corrected bits (which are diffused), the un-diffused error-corrected data bits are decrypted 535, and the decrypted data bits are released 560 as plain text. In addition, the un-diffused error-corrected data bits are written 580 to RAM.

In the previous example, the diffusion function (and corresponding inverse diffusion function, which is the inverse of the diffusion function), have been introduced in broad strokes. It is evident that different diffusion functions can be defined that serve the intended purpose, by defining different bijective projection functions between the origin space and the diffusion space. To further increase the protection against Rowhammer-like attacks, different bijective projection functions (and thus different diffusion functions) may be used for different portions of the memory (or by different memory controllers). For this purpose, the concept of "secret keys" or "keys" is introduced (the terms are used interchangeably). For example, the keys, e.g., codebooks comprising the keys, may be stored in the memory circuitry 16 of the apparatus 10. For example, the diffusion function may be based on at least one secret key. The (secret) keys define the respective diffusion function, with each key or secret key defining a different bijective projection. In this context, the (secret) keys might be considered symmetrical encryption keys for block-wise encryption and decryption of the data bits and/or ECC bits (which is done in addition to the memory encryption).

To apply the different keys, the circuitry being used to diffuse or inverse-diffuse the respective bits may be supplied with the respective keys. This can be done using multiplexing circuitry, as shown in FIGS. 7, 8, 9a and 9b. For example, the processor circuitry may multiplex between using different keys of a codebook when applying the diffusion function. Accordingly, as further shown in FIGS. 1c and 1d, as this applies both to the write flow and the read flow, the method may comprise multiplexing 110 between using different keys of a codebook when applying the diffusion function. For example, in FIGS. 7 and 9a, key selection circuitry 760 and multiplexing circuitry 765 are shown for multiplexing between the different keys at the diffusion circuitry 750, 755. In FIGS. 8 and 9b, key selection circuitry 850 and multiplexing circuitry 855 are shown for multiplexing between the different keys at the inverse diffusion circuitry 840, 845 and at the diffusion circuitry (marked "D" in FIG. 9b).

Different keys may be applied at different levels of granularity. For example, different memory controllers may use different keys for the diffusion function and the inverse diffusion function. For example, the diffusion may be based on a codebook of secret keys, with a different codebook being used by each memory controller. This may increase the protection against Rowhammer-like attacks across different portions of memory handled by different memory controllers. Additionally, or alternatively, a separate secret key may be used for each trusted domain (e.g., each domain of a Trusted Execution Environment, TEE) of the computer system 1000 comprising the apparatus. This has the effect that, even if software running in a trusted domain manages to reconstruct the diffusion function used for the trusted domain, it is unable to manipulate other trusted domains. Moreover, different secret keys (or at least tweaks to secret keys) may be applied with a block-by-block granularity. For example, if the diffusion function is a block-wise function, a separate secret key or a separate tweak may be used for each block of memory. In this context, a tweak is a small input that is fed into the diffusion algorithm to modify its operation in a in a deterministic way. The use of tweaks enables the diffusion function to produce different outputs for the same input bits by using different tweaks.

Figure 2:
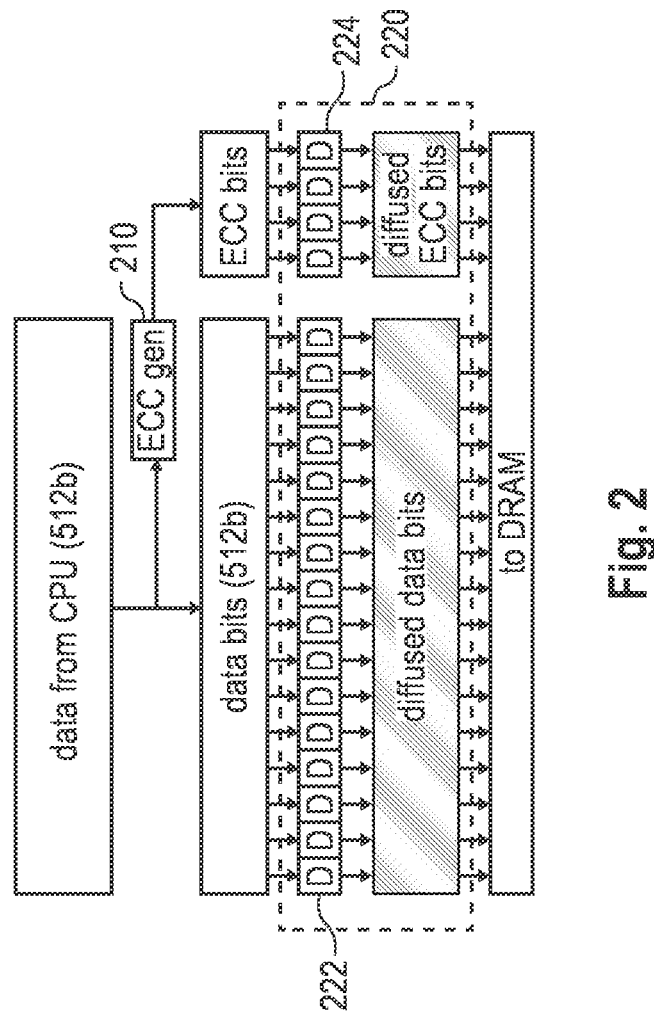
FIG. 2 illustrates a diffusion layer wherein data and ECC bits are divided into s-bit blocks (e.g., 8-bit or 16-bit blocks) and a bijective diffusion function D is applied to each block according to an example.

In general, the processor circuitry or means for processing may be implemented using one or more processing units, one or more processing devices, any means for processing, such as a processor, a computer or a programmable hardware component being operable with accordingly adapted software. In other words, the described function of the processor circuitry 14 may as well be implemented in software, which is then executed on one or more programmable hardware components. Such hardware components may comprise a general-purpose processor, a Digital Signal Processor (DSP), a micro-controller, etc. In some cases, the processor circuitry or means for processing may comprise dedicated circuitry for performing the respective tasks. For example, as shown in FIG. 2 (diffusion circuitry 222, 224), FIGS. 3a-3b (the inverse diffusion blocks $D^{-1}$), FIGS. 4a-4d (diffusion circuitry 430, 435, inverse diffusion circuitry 450, 455), FIG. 6 (Blinding/Diffusion block 630), FIG. 7 (diffusion circuitry 750), FIG. 8 (inverse diffusion circuitry 840), FIG. 9a (diffusion circuitry 750, 755) and FIG. 9b (inverse diffusion circuitry 845, and the diffusion circuitry marked "D"), the processor circuitry may comprise circuitry to apply the diffusion function and circuitry to apply an inverse diffusion function. Additionally, or alternatively, the processor circuitry may comprise circuitry to calculate the ECC bits, circuitry to determine, whether ECC error correction may be necessary, and circuitry to perform ECC error correction. For example, such circuitry is shown in FIG. 2 (ECC generator 210), FIGS. 4a-4d (ECC circuitry 420 and 460), FIG. 6 (ECC block 620), FIGS. 7 and 9a (ECC generator 730), and FIGS. 8 and 9b (ECC decoder 860). In some examples, as shown in FIGS. 4a to 4d (memory encryption circuitry 410, memory decryption circuitry 420), the processor circuitry may comprise circuitry to encrypt unencrypted data bits to obtain the data bits, and circuitry to decrypt the data bits. Moreover, in some examples, e.g., examples where multiple keys are used, the processor circuitry may comprise circuitry to multiplex between using different keys of a codebook when applying the diffusion function or an inverse diffusion function. Examples for such circuitry are shown in FIGS. 7 to 9b (key selection circuitry 760, multiplexing circuitry 765, key selection circuitry 850 and multiplexing circuitry 855).

The interface circuitry 12 or means for communicating 12 may correspond to one or more inputs and/or outputs for receiving and/or transmitting information, which may be in digital (bit) values according to a specified code, within a module, between modules or between modules of different entities. For example, the interface circuitry 12 or means for communicating 12 may comprise interface circuitry configured to receive and/or transmit information.

More details and aspects of the apparatus 10, device 10, method, of a corresponding computer program, the memory controller 100 and the (computer) system 1000 are mentioned in connection with the proposed concept or one or more examples described above or below (e.g., FIGS. 2 to 13). The apparatus 10, device 10, method, corresponding computer program, the memory controller 100 and the (computer) system 1000 may comprise one or more additional optional features corresponding to one or more aspects of the proposed concept, or one or more examples described above or below.

Various examples of the present disclosure relate to Message Authentication Galois Integrity and Correction (MAGIC) for lightweight row hammer mitigation. The technology described herein provides a method and system increases computer security by adding cryptographic s-bit diffusion on top of existing ECC processing (e.g., Reed-Solomon code processing), leaving the error-correction capabilities of the Reed-Solomon code unchanged. As long as an attacker cannot read the stored redundant information, authenticity is added, thereby precluding row hammer attacks. Assuming that memory encryption (such as multi-key total memory encryption (MKTME)) is in place, the technology described herein can be applied without a latency penalty on memory reads.

Due to shrinks in process technologies for DRAM, the abilities of attackers to mount row hammer attacks are likely to get worse. The technology described herein provides protection against this attack vector with only a small impact on performance.

As used herein, "processor circuitry", "processor circuitry" or "hardware resources" is defined to include (i) one or more special purpose electrical circuits structured to perform specific operation(s) and including one or more semiconductor-based logic devices (e.g., electrical hardware implemented by one or more transistors), and/or (ii) one or more general purpose semiconductor-based electrical circuits programmed with instructions to perform specific operations and including one or more semiconductor-based logic devices (e.g., electrical hardware implemented by one or more transistors). Examples of processor circuitry include programmed microprocessors, Field Programmable Gate Arrays (FPGAs) that may instantiate instructions, Central Processor Units (CPUs), Graphics Processor Units (GPUs), Digital Signal Processors (DSPs), XPUs, or microcontrollers and integrated circuits such as Application Specific Integrated Circuits (ASICs). For example, an XPU may be implemented by a heterogeneous computing system including multiple types of processor circuitry (e.g., one or more FPGAs, one or more CPUs, one or more GPUs, one or more DSPs, etc., and/or a combination thereof) and application programming interface(s) (API(s)) that may assign computing task(s) to whichever one(s) of the multiple types of the processor circuitry is/are best suited to execute the computing task(s).

As used herein, a computing system or computer system can be, for example, a server, a personal computer, a workstation, a self-learning machine (e.g., a neural network), a mobile device (e.g., a cell phone, a smart phone, a tablet (such as an iPad™)), a personal digital assistant (PDA), an Internet appliance, a DVD player, a CD player, a digital video recorder, a Blu-ray player, a gaming console, a personal video recorder, a set top box, a headset (e.g., an augmented reality (AR) headset, a virtual reality (VR) headset, etc.) or other wearable device, or any other type of computing device.

There have been several previous approaches to attempt to mitigate row hammer attacks in computing systems, including adding cryptographic authentication via a message authentication code (MAC), implementing Message Authentication Galois Integrity and Correction (MAGIC) with 64/128-bit blocks providing simultaneous data authentication and error correction, implementing Target Row Refresh (TRR) in double data rate 4 synchronous DRAM (DDR4), and using Error Correction Codes (ECC).

MACs require the storage of additional information called tags to verify the authenticity of data. This additional tag information reduces the space available for the redundant information of ECC, thus negatively impacting error correction capabilities. The technology described herein does not require additional ECC bits or sequestered memory. MAGIC with 128-bit blocks provides error correction on bit-level with no storage overhead. However, it lacks the capabilities of currently deployed ECC of handling full-device or partial device failures. While some MAGIC implementations provide error correction and message authentication, it requires major changes in the ECC engine due to the use of a completely different algorithm, which requires additional design and validation effort. The proposed row hammer mitigation technique described herein builds upon existing an ECC engine, and hence is much easier to implement and validate.

TRR does not protect against TRR-aware variants of row hammer. While ECC is effective in detecting (and possibly correcting) random corruptions, it can be bypassed by inducing targeted errors that are undetected or mis-corrected by the ECC algorithm.

DRAM is made from tiny capacitors for each bit that store charges symbolling a stored 0 or 1. Parasitic effects lead to a discharge of the capacitors over time, so that the information has to be periodically read and refreshed. Those parasitic effects can be influenced by manipulating capacitors in close physical proximity that are under adversarial control. This can lead to a change in the charge of a victim capacitor before the information is refreshed and hence to a change in the victim's data stored. Many exploits can make use of this effect ranging from privilege escalation to the manipulation of cryptographic keys invalidating the confidentiality of all future communications.

The root cause of the problem is the shrinking in process technology leading to declining capacities, closer physical proximities, and worse parasitic effects, together with the interval for refreshing. It is unlikely that there will be a reversal (e.g., physical enlargement) in process technologies. In addition, an increase in the refresh interval is unlikely to happen due to severe performance impacts.

The technology described herein applies a block-wise diffusion on top of data and ECC bits, which makes it difficult for a row hammer adversary to bypass ECC by inducing errors that are undetected or mis-corrected.

FIG. 2 illustrates a diffusion layer 220 wherein data and ECC bits (provided by ECC generator 210) are divided into s-bit blocks (e.g., 8-bit or 16-bit blocks) and a bijective diffusion function D 222, 224 is applied to each block according to an example. The diffusion layer 220 does not affect error correction in a normal case, as long as any errors are within correctable boundaries of the ECC processing. For instance, a 16-bit Reed-Solomon code corrects entire 16-bit symbols, regardless of what bits are corrupted within a symbol, so a 16-bit diffusion will have no impact in this case.

Figure 3A:
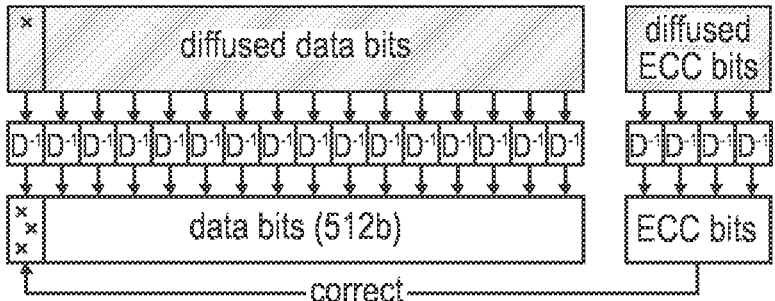
FIG. 3a shows how a single-bit error in DRAM is translated to multiple-bit errors within the same symbol or block in one example.

FIG. 3a shows how a single-bit error in DRAM is translated to multiple-bit errors within the same symbol or block but ECC processing can still correct the error in one example.

Figure 3B:
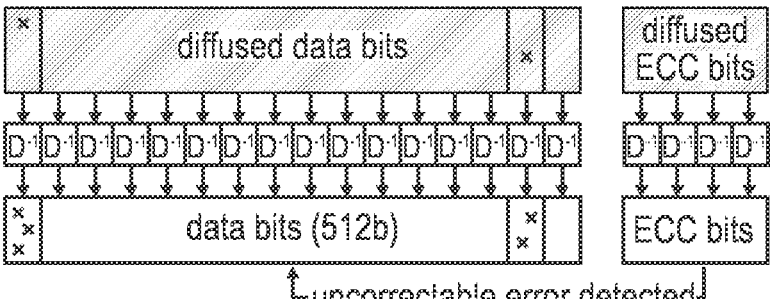
FIG. 3b illustrates an uncorrectable error being detected according to one example.

A row hammer adversary needs to corrupt a specific combination of bits spread across multiple blocks in order to achieve an undetected/mis-corrected error. However, as shown in FIG. 3b, application of an inverse diffusion block effectively "randomizes" errors before error correction, so a row hammer adversary has no deterministic way of causing such an error, since diffusion is data dependent.

As shown in FIG. 4a, in a first approach, memory encryption may be used in conjunction with an inside-out style s-bit MAGIC. This means when writing data to memory, memory encryption 410 is performed first, then the ECC 420 is computed, followed by the diffusion (DIFF) layer 430, 435. The result is then stored in a memory 440 (e.g., RAM). The total latency overhead versus a plain write to memory is the sum of the latencies of memory encryption, ECC, and diffusion processing.

As shown in FIG. 4b, to read data from memory, first the (inverse) diffusion layer 450. 455 is computed, then the ECC 460, and then memory decryption 470 is performed.

In a second approach, memory encryption may be used in conjunction with outside-in s-bit MAGIC. In this case, the order of operations for writing data to memory is as shown in FIG. 4c. First, the raw data is encrypted 410 (by e.g., multi-key total memory encryption (MKTME)). The resulting ciphertext is stored in memory 440 and forms the input to simultaneous data authentication and error correction. The simultaneous data authentication and error correction feeds the ciphertext through parallel diffusor blocks (Diff) 430. The diffused ciphertext now forms the input to an error correcting code (ECC) 420, which computes the redundant information used for authentication and error correction. The redundant information is diffused 435 again and stored in memory 440. The total latency overhead versus a plain write to memory is the sum of the latencies of memory encryption, ECC, and two times the Diffusion.

However, when examining a read from memory in FIG. 4d, it can be observed that decryption 470 and simultaneous data authentication and error correction (comprising diffusing 430 the data read from memory, applying an inverse diffusion function 455 on the ECC bits read from memory and performing ECC error checking/correction 460) can be potentially done in parallel. This means that the added latency over a plain read from memory is potentially the maximum of the latency of memory encryption and the latency of diffusion plus ECC. If the latency of memory decryption dominates, there is no additional latency penalty from adding simultaneous data authentication and error correction.

If it can be assumed that errors in memory are rare, it can make sense from a performance perspective to not wait until the check for correctness of data by MAGIC is performed and only then start the decryption. Rather, it makes sense to start decryption as early as possible and then pull the data back in case an error is detected or corrected. Speculative decryption is possible for the first example of performing the memory encryption and then inside-out MAGIC as shown in FIG. 4a and for the second example of performing memory encryption and then outside-in MAGIC as shown in FIG. 4c. One advantage of outside-in MAGIC is that memory decryption, shown in FIG. 4d, does not have to wait for the inverse diffusion to complete before memory decryption can be start.

FIG. 5a is a flow diagram of data processing according to the first example. In the first example, data is read 510 from RAM, and inverse diffusion is applied 520, 525 on the data read from RAM. On the data bits, memory decryption 530 is performed, and ECC is validated on the inverse-diffused data bits and inverse-diffused ECC bits read from RAM 540. If no error is detected, the plaintext of the data bits is released 560. If an error is detected, and the error is correctable, the error is corrected 550, memory decryption 535 is performed on the ECC-corrected data bits, and the data bits are released 560 as plain text. In addition, diffusion 570 is applied on the ECC-corrected data bits and the diffused ECC-corrected data bits are written 580 to RAM. If the error is not correctable, an error is reported 590.

FIG. 5b is a flow diagram of data processing according to the second example. In the second example, data is read 510 from RAM, and inverse diffusion is applied 525 on the ECC bits read from RAM. On the data bits, memory decryption 530 is performed, and ECC is validated 540 on the data bits and the inverse-diffused ECC bits. If no error is detected, the plaintext of the data bits is released 560. If an error is detected, and the error is correctable, the error is corrected 550, inverse diffusion 520 is applied on the ECC-corrected bits, memory decryption 535 is performed on the ECC-corrected data bits, and the data bits are released 560 as plain text. In addition, the diffused ECC-corrected data bits are written 580 to RAM. If the error is not correctable, an error is reported 590.

In all cases, it is also possible to do the decryption in-order (performing the memory decryption can wait until MAGIC is completed).

For example, the proposed scheme may be implemented using a Reed-Solomon code working on s-bit symbols adding 1 symbol. Such a Reed-Solomon code can correct up to ½ erroneous symbols. Adding a bijective s-bit diffusion does not change this property.

The purpose of the s-bit diffusor blocks (e.g., D) is that from an adversarial perspective, changes on the input of the diffusor lead to changes to the output of the diffuser that can only be predicted probabilistically by the adversary. Then, although the ECC is known, a silent data corruption happens also only with a certain probability and cannot be deterministically forced by the adversary. Therefore, it is advantageous for the diffusors to use a secret key K that is randomly chosen. In addition, each $D_i^K$ has to be a different bijection, so that same inputs do not lead to same outputs. Furthermore, an attacker should not be able to read the diffused ECC bits if s is small. For a small s, the full codebook for each $D_i^K$ is quickly exhausted and knowing diffused ECC bits and diffused data bits reveals partial knowledge about this codebook via the ECC that might be used to craft silent data corruptions.

The present system works with any sound and secure memory encryption scheme. The present system does not change the characteristics of symbol-based error correction codes such as Reed-Solomon codes as long as the symbol size matches the block size of the diffusion layer. However, non-matching combinations are also possible. The resulting security levels depend on the code and should be checked. The diffusion layer consists of the parallel application of bijective s-bit diffusors. In one example, such diffusors can be s-bit (tweakable) block ciphers. However, due to the limited capabilities of a row hammer attacker, cryptographically weaker constructions may also be used.

Some examples of the proposed concept relates to Rowhammer mitigation using multi-key blinding for trusted execution environment. In the following, an enhancement of the techniques discussed in connection with FIGS. 2 to 5b is presented. In connection with FIGS. 2 to 5b, diffusion (which may also be denoted as blinding) of data and error-correction code (ECC) bits is performed through a cryptographic transformation using a single key. MAGIC-RH obfuscates silent data error (SDE) patterns that are static in traditional ECC and hence can be exploited by a Rowhammer (RH) adversary to inject errors undetected by the ECC. With MAGIC-RH, SDE patterns depend on data and secret key, which are not visible to a software RH adversary.

This technology builds on top of an existing ECC engine, and it does not require additional ECC bits for storing metadata such as MACs. Therefore, all ECC bits are available for RAS. An advanced RH adversary that colludes with untrusted software (e.g., untrusted or compromised VMM) with potential read capability of data/ECC bits stored in DRAM might be able to reverse-engineer the blinding key and carry out an attack on a trusted domain (running within a TEE), as the keys are global and static within a boot cycle. The techniques discussed in connection with FIGS. 6 to 9b provide an enhancement and extension of the technique discussed in connection with FIGS. 2 to 5b by using multiple diffusion/blinding keys to separate TEE and non-TEE entities. However, the techniques discussed in FIGS. 6 to 9b build upon the techniques discussed in connection and may be seamlessly combined together. In other words, the use of multiple diffusions keys can be applied on the examples provided in connection with FIGS. 2 to 5b.

While Multi-key Total Memory Encryption (TME-MK) can be applied as an alternative to the proposed scheme, TME-MK provides encryption of data written to DRAM, however, a compromised VMM can disable encryption for its own memory and perform pre-characterization within its own domain.

Per-domain MAC is effective against detecting data corruption injected via a Rowhammer attack by a malicious software. However, storing MACs in memory requires additional storage. If stored inline, MACs displace ECC bits and reduce RAS (Reliability, Availability, Serviceability), or if stored in sequestered memory, MACs reduce available memory and require additional memory accesses, increasing memory latency and reducing effective memory bandwidth.

In some examples shown in connection with FIGS. 6 to 9b, unique blinding keys may be used per trusted domain. Even if malicious non-TEE (Trusted Execution Environment) software discovers the blinding key for its memory, the memory of a TEE is still protected. Examples may provide enhanced resilience against Rowhammer attacks in trusted execution environment (e.g., Intel® Trusted Domain Extensions, TDX), without prenasalising performance or RAS.

Data and ECC bits are "diffused" (e.g., blinded) using a cryptographic function when written to memory. This function takes N bits of data, M bits of a secret key, and potentially L bits of a tweak as input. It outputs N bits of "diffused" data. This operation is reversible when using the same key. Any errors injected in DRAM will undergo a non-linear transformation together with read data on a read operation, resulting in a corruption of the N-bit data block that is difficult to pre-calculate without knowing both data and key. This corruption does not affect normal ECC capability, as it already operates on larger boundaries, e.g., full-device correction regardless of the error pattern, as long as it is limited to one device. The figure below shows the position of diffusion engines in the write path.

Figure 6:
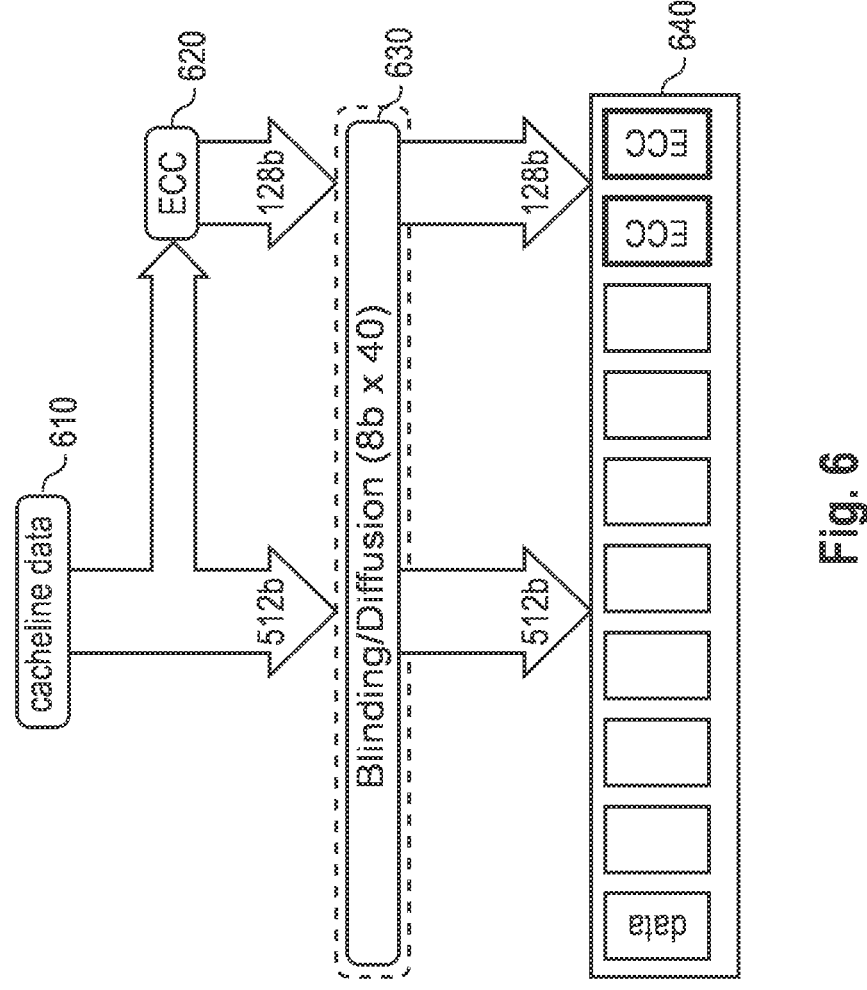
FIG. 6 shows an example of a write operation.

FIG. 6 shows an example of a write operation, as a high-level overview of the techniques applied in connection with FIGS. 1a to 5b, 7 to 9b. Cacheline data 610 (e.g., 512-bit wide) is provided to an ECC generator 620 (which generates 128-bit wide ECC bits). The cacheline data 610 and the ECC bits are provided to a diffusion/diffusion layer 630, with the diffused data bits and ECC bits being written to memory 640.

Instead of a single (global) diffusion key, some examples make use of selectable, unique, secret keys. Keys are selected by the key selector via a key multiplexer. For example, each valid key selector value may be associated with a trusted domain. For instance, TME-MK encryption key IDs can be used as key selector, such that each domain with a different data encryption key also uses a different diffusion key (e.g., blinding key).

FIG. 7 shows a write flow of a variation of the first example shown in connection with FIGS. 4a, 4b and 5a. Cacheline data 710 from the CPU (e.g., 512b wide) are provided as data bits 720 and to an ECC generator 730. The ECC generator 730 generates ECC bits 740. Both the data bits 720 and the ECC bits 740 are processed by a diffusion function 750 to generate diffused data bits 725 and diffused ECC bits 745, which are written to memory 770. In addition to the write flow of example 1, the diffusion function 750 is parametrized by a key that is provided by a key multiplexer 765 being controlled by a key selector 760. On a write, the key selector 760 is provided with the cacheline data (e.g., MKTME Key Identifier, and/or a TD (Trusted Domain) bit, which is used by TDX to distinguish whether the cacheline data stored in DRAM belongs to a Trust Domain or not. In more general terms, the TD bit is a TEE (Trusted Execution Environment) bit to distinguish whether the cacheline data stored in DRAM belongs to a TEE, etc.). Based on the key identifier provided, the appropriate key is selected from the key registers Key[0] Key[K−1] and provided to the diffusion engines ("D") 750 as input, as shown FIG. 7. The diffused data and ECC bits are then written to DRAM.

FIG. 8 shows a read flow of a variation of the first example. On reads, diffused data and ECC bits are retrieved from DRAM 810. The key selector 850 provided with the read request selects the corresponding diffusion key (via the key multiplexer 855) that the diffusion engines 840 then use to "unblind" the bits $(D^{-1})$ as shown in FIG. 8. The resulting data bits 825 and ECC bits 835 proceed to the ECC engine 860 for error checking and correction before being provided to the CPU 870. If the key selector value on the read request matches that used on the write of that data, all N-bit blocks without errors are decrypted correctly, therefore normal operation is not affected by the diffusion operation, as well as the error correction capability, assuming the errors stay within the limits of the error correction algorithm.

If a malicious entity (e.g., untrusted VMM) discovers the diffusion key of its own key domain and hence can pre-calculate the SDE pattern for its own domain, it cannot transfer this information to a different domain and forge a deterministic SDE pattern there due to a different diffusion key. So cross-domain attacks become probabilistic, which provides a high level of detectability of cross-domain Rowhammer attacks.

In FIGS. 9a and 9b, an alternative implementation (with a "blind-than-ECC" approach) is shown, which is similar to the second example discussed in connection with FIGS. 4c, 4d and 5b. To facilitate the identification of difference to variation of the first example shown in FIGS. 7 and 8, the reference numerals used in FIGS. 7 and 8 are also used in FIGS. 9a and 9b, respectively. FIG. 9a shows a write flow of a variation of the second example, and FIG. 9b shows a read flow of a variation of the second example.

In the alternative implementation, the data bits 720 are diffused (i.e., blinded, using diffusion function 750) before generating (using ECC generator 730) ECC bits 740 over the diffused data bits 725. Instead of storing the diffused data bits 725, the undiffused (raw) data bits are stored in DRAM 770. The resulting ECC bits 740 are diffused 755 before being written to DRAM 770 together with the raw data 720. An advantage of this construction is that even if the adversary manages to obtain the data in DRAM, they don't have the knowledge of what was the input to the ECC engine. This makes it computationally more difficult to pre-calculate forgeries that will result in an SDC. FIG. 9a shows the write flow. Like the write flow shown in FIG. 7, the key selector 760 selects the diffusion key (blinding key) for diffusing data and ECC.

On a read, raw data read from the DRAM 810 is diffused (as it is not diffused before being written to DRAM), and the diffused ECC bits 830 are undiffused 835 to be used as inputs to the ECC decoder 860. The verified or corrected data bits 825 are then sent to the CPU 870. Same as in the read flow shown in FIG. 8, the key selector 850 provided on the read request selects the appropriate key for the diffusion/undiffusion (e.g., inverse diffusion) engines.

In some examples, instead of using a key selector to select between different stored keys, the key selector can be used to derive the key material from a single stored master key via a key derivation function. Recommendations for such key derivation functions can be found in NIST Special Publication 800-108r1.

While an example manner of implementing the technology described herein is illustrated in FIGS. 1a-9b, one or more of the elements, processes, and/or devices illustrated in FIGS. 1a-9b may be combined, divided, re-arranged, omitted, eliminated, and/or implemented in any other way. Further, the example diffusion layer may be implemented by hardware, software, firmware, and/or any combination of hardware, software, and/or firmware. Thus, for example, any of the diffusion layer could be implemented by processor circuitry, analog circuit(s), digital circuit(s), logic circuit(s), programmable processor(s), programmable microcontroller(s), graphics processing unit(s) (GPU(s)), digital signal processor(s) (DSP(s)), application specific integrated circuit(s) (ASIC(s)), programmable logic device(s) (PLD(s)), and/or field programmable logic device(s) (FPLD(s)) such as Field Programmable Gate Arrays (FPGAs). When reading any of the apparatus or system claims of this patent to cover a purely software and/or firmware implementation, at least one of the example hardware resources is/are hereby expressly defined to include a non-transitory computer readable storage device or storage disk such as a memory, a digital versatile disk (DVD), a compact disk (CD), a Blu-ray disk, etc., including the software and/or firmware. Further still, the example circuitry of FIGS. 1a-9b may include one or more elements, processes, and/or devices in addition to, or instead of, those illustrated in FIGS. 1a-9b, and/or may include more than one of any or all the illustrated elements, processes, and devices.

Flowcharts representative of example hardware logic circuitry, machine readable instructions, hardware implemented state machines, and/or any combination thereof is shown in FIGS. 1c-2, 4a-9b. The machine readable instructions may be one or more executable programs or portion(s) of an executable program for execution by processor circuitry, such as the processor circuitry 1012 shown in the example processor platform 1000 discussed below in connection with FIG. 10 and/or the example processor circuitry discussed below in connection with FIGS. 11 and/or 12. The program may be embodied in software stored on one or more non-transitory computer readable storage media such as a CD, a floppy disk, a hard disk drive (HDD), a DVD, a Blu-ray disk, a volatile memory (e.g., Random Access Memory (RAM) of any type, etc.), or a non-volatile memory (e.g., FLASH memory, an HDD, etc.) associated with processor circuitry located in one or more hardware devices, but the entire program and/or parts thereof could alternatively be executed by one or more hardware devices other than the processor circuitry and/or embodied in firmware or dedicated hardware. The tangible machine-readable instructions may be distributed across multiple hardware devices and/or executed by two or more hardware devices (e.g., a server and a client hardware device). For example, the client hardware device may be implemented by an endpoint client hardware device (e.g., a hardware device associated with a user) or an intermediate client hardware device (e.g., a radio access network (RAN) gateway that may facilitate communication between a server and an endpoint client hardware device). Similarly, the non-transitory computer readable storage media may include one or more mediums located in one or more hardware devices. Further, although the example program is described with reference to the flowcharts illustrated in FIGS. 1a-9b, many other methods of implementing the example computing system may alternatively be used. For example, the order of execution of the blocks may be changed, and/or some of the blocks described may be changed, eliminated, or combined. Additionally, or alternatively, any or all of the blocks may be implemented by one or more hardware circuits (e.g., processor circuitry, discrete and/or integrated analog and/or digital circuitry, an FPGA, an ASIC, a comparator, an operational-amplifier (op-amp), a logic circuit, etc.) structured to perform the corresponding operation without executing software or firmware. The processor circuitry may be distributed in different network locations and/or local to one or more hardware devices (e.g., a single-core processor (e.g., a single core central processor unit (CPU)), a multi-core processor (e.g., a multi-core CPU), etc.) in a single machine, multiple processors distributed across multiple servers of a server rack, multiple processors distributed across one or more server racks, a CPU and/or a FPGA located in the same package (e.g., the same integrated circuit (IC) package or in two or more separate housings, etc.).

The machine-readable instructions described herein may be stored in one or more of a compressed format, an encrypted format, a fragmented format, a compiled format, an executable format, a packaged format, etc. Machine readable instructions as described herein may be stored as data or a data structure (e.g., as portions of instructions, code, representations of code, etc.) that may be utilized to create, manufacture, and/or produce machine executable instructions. For example, the machine-readable instructions may be fragmented and stored on one or more storage devices and/or computing devices (e.g., servers) located at the same or different locations of a network or collection of networks (e.g., in the cloud, in edge devices, etc.). The machine-readable instructions may require one or more of installation, modification, adaptation, updating, combining, supplementing, configuring, decryption, decompression, unpacking, distribution, reassignment, compilation, etc., in order to make them directly readable, interpretable, and/or executable by a computing device and/or other machine. For example, the machine-readable instructions may be stored in multiple parts, which are individually compressed, encrypted, and/or stored on separate computing devices, wherein the parts when decrypted, decompressed, and/or combined form a set of machine executable instructions that implement one or more operations that may together form a program such as that described herein.

In another example, the machine-readable instructions may be stored in a state in which they may be read by processor circuitry, but require addition of a library (e.g., a dynamic link library (DLL)), a software development kit (SDK), an application programming interface (API), etc., in order to execute the machine-readable instructions on a particular computing device or other device. In another example, the machine-readable instructions may need to be configured (e.g., settings stored, data input, network addresses recorded, etc.) before the machine-readable instructions and/or the corresponding program(s) can be executed in whole or in part. Thus, machine readable media, as used herein, may include machine readable instructions and/or program(s) regardless of the particular format or state of the machine-readable instructions and/or program(s) when stored or otherwise at rest or in transit.

The machine-readable instructions described herein can be represented by any past, present, or future instruction language, scripting language, programming language, etc. For example, the machine-readable instructions may be represented using any of the following languages: C, C++,

19

Java, C #, Perl, Python, JavaScript, HyperText Markup Language (HTML), Structured Query Language (SQL), Swift, etc.

As mentioned above, the example operations of FIGS. 1c-2, 4a-9b, may be implemented using executable instructions (e.g., computer and/or machine readable instructions) stored on one or more non-transitory computer and/or machine readable media such as optical storage devices, magnetic storage devices, an HDD, a flash memory, a read-only memory (ROM), a CD, a DVD, a cache, a RAM of any type, a register, and/or any other storage device or storage disk in which information is stored for any duration (e.g., for extended time periods, permanently, for brief instances, for temporarily buffering, and/or for caching of the information). As used herein, the terms non-transitory computer readable medium and non-transitory computer readable storage medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements or method actions may be implemented by, e.g., the same entity or object. Additionally, although individual features may be included in different examples or claims, these may possibly be combined, and the inclusion in different examples or claims does not imply that a combination of features is not feasible and/or advantageous.

Figure 10:
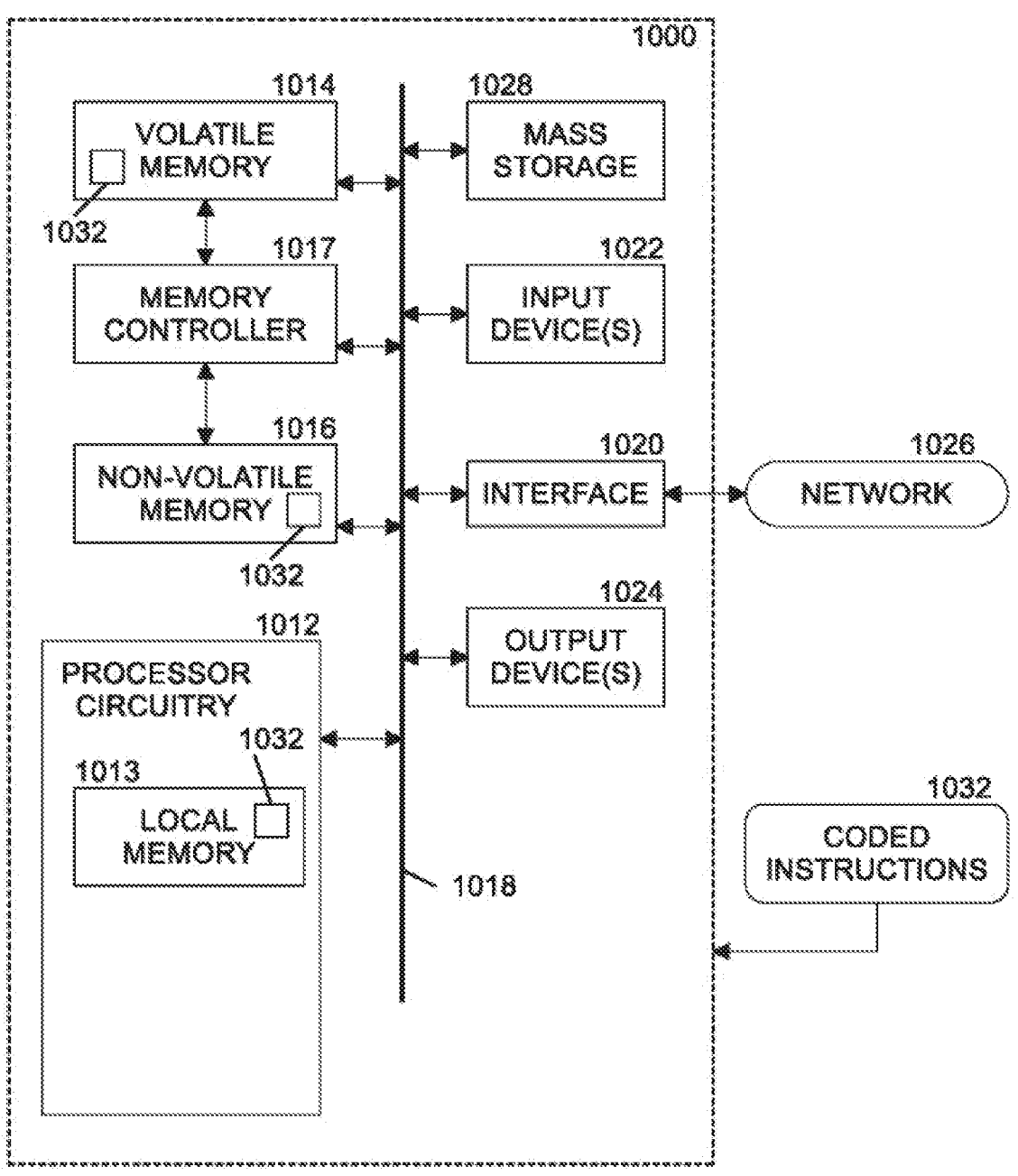
FIG. 10 is a block diagram of an example processor platform.

FIG. 10 is a block diagram of an example processor platform 1000 structured to execute and/or instantiate the machine-readable instructions and/or operations of FIGS. 1c-2, 4a-9b. The processor platform 1000 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset (e.g., an augmented reality (AR) headset, a virtual reality (VR) headset, etc.) or other wearable device, or any other type of computing device.

The processor platform 1000 of the illustrated example includes processor circuitry 1012. The processor circuitry 1012 of the illustrated example is hardware. For example, the processor circuitry 1012 can be implemented by one or more integrated circuits, logic circuits, FPGAs microprocessors, CPUs, GPUs, DSPs, and/or microcontrollers from any desired family or manufacturer. The processor circuitry 1012 may be implemented by one or more semiconductor based (e.g., silicon based) devices. In this example, the processor circuitry 1012 implements the example processor circuitry 122.

The processor circuitry 1012 of the illustrated example includes a local memory 1013 (e.g., a cache, registers, etc.). The processor circuitry 1012 of the illustrated example is in communication with a main memory including a volatile memory 1014 and a non-volatile memory 1016 by a bus 1018. The volatile memory 1014 may be implemented by Synchronous Dynamic Random Access Memory (SDRAM), Dynamic Random Access Memory (DRAM), RAMBUS® Dynamic Random Access Memory (RDRAM®), and/or any other type of RAM device. The non-volatile memory 1016 may be implemented by flash memory and/or any other desired type of memory device. Access to the main memory 1014, 1016 of the illustrated example is controlled by a memory controller 1017.

The processor platform 1000 of the illustrated example also includes interface circuitry 1020. The interface circuitry 1020 may be implemented by hardware in accordance with any type of interface standard, such as an Ethernet interface, a universal serial bus (USB) interface, a Bluetooth® interface, a near field communication (NFC) interface, a PCI interface, and/or a PCIe interface.

In the illustrated example, one or more input devices 1022 are connected to the interface circuitry 1020. The input device(s) 1022 permit(s) a user to enter data and/or commands into the processor circuitry 1012. The input device(s) 1022 can be implemented by, for example, an audio sensor, a microphone, a camera (still or video), a keyboard, a button, a mouse, a touchscreen, a trackpad, a trackball, an isopoint device, and/or a voice recognition system.

One or more output devices 1024 are also connected to the interface circuitry 1020 of the illustrated example. The output devices 1024 can be implemented, for example, by display devices (e.g., a light emitting diode (LED), an organic light emitting diode (OLED), a liquid crystal display (LCD), a cathode ray tube (CRT) display, an in-place switching (IPS) display, a touchscreen, etc.), a tactile output device, a printer, and/or speaker. The interface circuitry 1020 of the illustrated example, thus, typically includes a graphics driver card, a graphics driver chip, and/or graphics processor circuitry such as a GPU.

The interface circuitry 1020 of the illustrated example also includes a communication device such as a transmitter, a receiver, a transceiver, a modem, a residential gateway, a wireless access point, and/or a network interface to facilitate exchange of data with external machines (e.g., computing devices of any kind) by a network 1026. The communication can be by, for example, an Ethernet connection, a digital subscriber line (DSL) connection, a telephone line connection, a coaxial cable system, a satellite system, a line-of-site wireless system, a cellular telephone system, an optical connection, etc.

The processor platform 1000 of the illustrated example also includes one or more mass storage devices 1028 to store software and/or data. Examples of such mass storage devices 1028 include magnetic storage devices, optical storage devices, floppy disk drives, HDDs, CDs, Blu-ray disk drives, redundant array of independent disks (RAID) systems, solid state storage devices such as flash memory devices, and DVD drives.

The machine executable instructions 1032, which may be implemented by the machine-readable instructions of FIGS. 1c-2, 4a-9b, may be stored in the mass storage device 1028, in the volatile memory 1014, in the non-volatile memory 1016, and/or on a removable non-transitory computer readable storage medium such as a CD or DVD.

Figure 11:
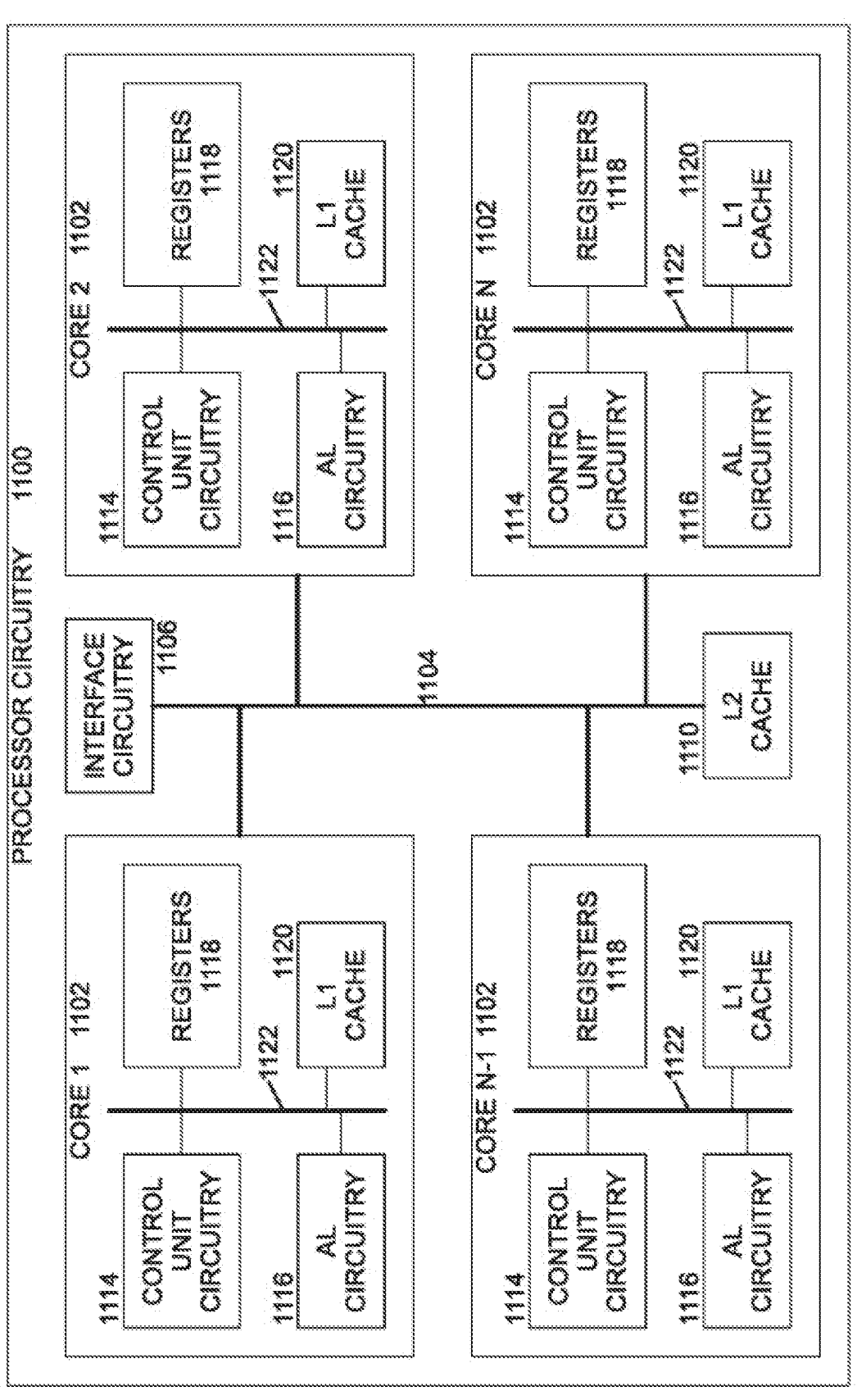
FIG. 11 is a block diagram of an example implementation of the processor circuitry of FIG. 10.

FIG. 11 is a block diagram of an example implementation of the processor circuitry 1012 of FIG. 10. In this example, the processor circuitry 1012 of FIG. 11 is implemented by a microprocessor 1100. For example, the microprocessor 1100 may implement multi-core hardware circuitry such as a CPU, a DSP, a GPU, an XPU, etc. Although it may include any number of example cores 1102 (e.g., 1 core), the microprocessor 1100 of this example is a multi-core semiconductor device including N cores. The cores 1102 of the microprocessor 1100 may operate independently or may cooperate to execute machine readable instructions. For example, machine code corresponding to a firmware program, an embedded software program, or a software program may be executed by one of the cores 1102 or may be executed by multiple ones of the cores 1102 at the same or different times. In some examples, the machine code corresponding to the firmware program, the embedded software program, or the software program is split into threads and executed in parallel by two or more of the cores 1102. The software program may correspond to a portion or all the machine-readable instructions and/or operations represented by the flowcharts of FIGS. 1c-2, 4a-9b.

The cores 1102 may communicate by an example bus 1104. In some examples, the bus 1104 may implement a communication bus to effectuate communication associated with one(s) of the cores 1102. For example, the bus 1104 may implement at least one of an Inter-Integrated Circuit (I2C) bus, a Serial Peripheral Interface (SPI) bus, a PCI bus, or a PCIe bus. Additionally, or alternatively, the bus 1104 may implement any other type of computing or electrical bus. The cores 1102 may obtain data, instructions, and/or signals from one or more external devices by example interface circuitry 1106. The cores 1102 may output data, instructions, and/or signals to the one or more external devices by the interface circuitry 1106. Although the cores 1102 of this example include example local memory 1120 (e.g., Level 1 (L1) cache that may be split into an L1 data cache and an L1 instruction cache), the microprocessor 1100 also includes example shared memory 1110 that may be shared by the cores (e.g., Level 2 (L2_ cache)) for high-speed access to data and/or instructions. Data and/or instructions may be transferred (e.g., shared) by writing to and/or reading from the shared memory 1110. The local memory 1120 of each of the cores 1102 and the shared memory 1110 may be part of a hierarchy of storage devices including multiple levels of cache memory and the main memory (e.g., the main memory 1014, 1016 of FIG. 10). Typically, higher levels of memory in the hierarchy exhibit lower access time and have smaller storage capacity than lower levels of memory. Changes in the various levels of the cache hierarchy are managed (e.g., coordinated) by a cache coherency policy.

Each core 1102 may be referred to as a CPU, DSP, GPU, etc., or any other type of hardware circuitry. Each core 1102 includes control unit circuitry 1114, arithmetic and logic (AL) circuitry (sometimes referred to as an ALU) 1116, a plurality of registers 1118, the L1 cache in local memory 1120, and an example bus 1122. Other structures may be present. For example, each core 1102 may include vector unit circuitry, single instruction multiple data (SIMD) unit circuitry, load/store unit (LSU) circuitry, branch/jump unit circuitry, floating-point unit (FPU) circuitry, etc. The control unit circuitry 1114 includes semiconductor-based circuits structured to control (e.g., coordinate) data movement within the corresponding core 1102. The AL circuitry 1116 includes semiconductor-based circuits structured to perform one or more mathematic and/or logic operations on the data within the corresponding core 1102. The AL circuitry 1116 of some examples performs integer-based operations. In other examples, the AL circuitry 1116 also performs floating point operations. In yet other examples, the AL circuitry 1116 may include first AL circuitry that performs integer-based operations and second AL circuitry that performs floating point operations. In some examples, the AL circuitry 1116 may be referred to as an Arithmetic Logic Unit (ALU). The registers 1118 are semiconductor-based structures to store data and/or instructions such as results of one or more of the operations performed by the AL circuitry 1116 of the corresponding core 1102. For example, the registers 1118 may include vector register(s), SIMD register(s), general purpose register(s), flag register(s), segment register(s), machine specific register(s), instruction pointer register(s), control register(s), debug register(s), memory management register(s), machine check register(s), etc. The registers 1118 may be arranged in a bank as shown in FIG. 11. Alternatively, the registers 1118 may be organized in any other arrangement, format, or structure including distributed throughout the core 1102 to shorten access time. The bus 1104 may implement at least one of an I2C bus, a SPI bus, a PCI bus, or a PCIe bus.

Each core 1102 and/or, more generally, the microprocessor 1100 may include additional and/or alternate structures to those shown and described above. For example, one or more clock circuits, one or more power supplies, one or more power gates, one or more cache home agents (CHAs), one or more converged/common mesh stops (CMSs), one or more shifters (e.g., barrel shifter(s)) and/or other circuitry may be present. The microprocessor 1100 is a semiconductor device fabricated to include many transistors interconnected to implement the structures described above in one or more integrated circuits (ICs) contained in one or more packages. The processor circuitry may include and/or cooperate with one or more accelerators. In some examples, accelerators are implemented by logic circuitry to perform certain tasks more quickly and/or efficiently than can be done by a general-purpose processor. Examples of accelerators include ASICs and FPGAs such as those discussed herein. A GPU or other programmable device can also be an accelerator. Accelerators may be on-board the processor circuitry, in the same chip package as the processor circuitry and/or in one or more separate packages from the processor circuitry.

Figure 12:
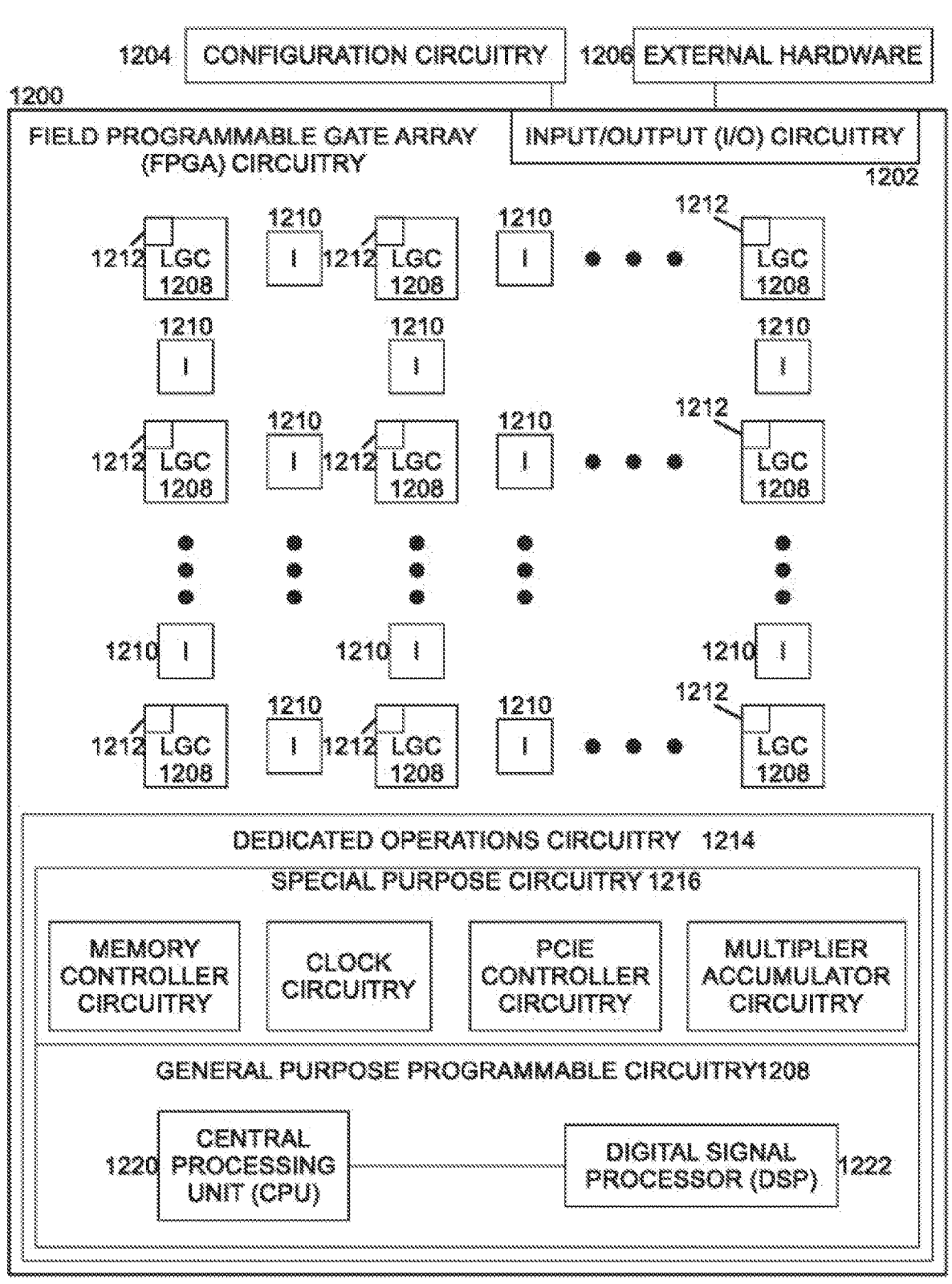
FIG. 12 is a block diagram of another example implementation of the processor circuitry of FIG. 10.

FIG. 12 is a block diagram of another example implementation of the processor circuitry 1012 of FIG. 10. In this example, the processor circuitry 1012 is implemented by FPGA circuitry 1200. The FPGA circuitry 1200 can be used, for example, to perform operations that could otherwise be performed by the example microprocessor 1100 of FIG. 11 executing corresponding machine-readable instructions. However, once configured, the FPGA circuitry 1200 instantiates the machine-readable instructions in hardware and, thus, can often execute the operations faster than they could be performed by a general-purpose microprocessor executing the corresponding software.

More specifically, in contrast to the microprocessor 1100 of FIG. 11 described above (which is a general purpose device that may be programmed to execute some or all of the machine readable instructions represented by the flowcharts of FIGS. 1c-2, 4a-9b but whose interconnections and logic circuitry are fixed once fabricated), the FPGA circuitry 1200 of the example of FIG. 12 includes interconnections and logic circuitry that may be configured and/or interconnected in different ways after fabrication to instantiate, for example, some or all of the machine readable instructions represented by the flowcharts of FIGS. 1c-2, 4a-9b. In particular, the FPGA 1200 may be thought of as an array of logic gates, interconnections, and switches. The switches can be programmed to change how the logic gates are interconnected by the interconnections, effectively forming one or more dedicated logic circuits (unless and until the FPGA circuitry 1200 is reprogrammed). The configured logic circuits enable the logic gates to cooperate in different ways to perform different operations on data received by input circuitry. Those operations may correspond to some, or all of the software represented by the flowcharts of FIGS. 1c-2, 4a-9b. As such, the FPGA circuitry 1200 may be structured to effectively instantiate some or all the machine-readable instructions of the flowcharts of FIGS. 1c-2, 4a-9b as dedicated logic circuits to perform the operations corresponding to those software instructions in a dedicated manner analogous to an ASIC. Therefore, the FPGA circuitry 1200 may perform the operations corresponding to the some or all of the machine-readable instructions of FIGS. 1c-2, 4a-9b faster than the general-purpose microprocessor can execute the same.

In the example of FIG. 12, the FPGA circuitry 1200 is structured to be programmed (and/or reprogrammed one or more times) by an end user by a hardware description language (HDL) such as Verilog. The FPGA circuitry 1200 of FIG. 12, includes example input/output (I/O) circuitry 1202 to obtain and/or output data to/from example configuration circuitry 1204 and/or external hardware (e.g., external hardware circuitry) 1206. For example, the configuration circuitry 1204 may implement interface circuitry that may obtain machine readable instructions to configure the FPGA circuitry 1200, or portion(s) thereof. In some such examples, the configuration circuitry 1204 may obtain the machine-readable instructions from a user, a machine (e.g., hardware circuitry (e.g., programmed, or dedicated circuitry) that may implement an Artificial Intelligence/Machine Learning (AI/ML) model to generate the instructions), etc. In some examples, the external hardware 1206 may implement the microprocessor 1100 of FIG. 11. The FPGA circuitry 1200 also includes an array of example logic gate circuitry 1208, a plurality of example configurable interconnections 1210, and example storage circuitry 1212. The logic gate circuitry

1208 and interconnections 1210 are configurable to instantiate one or more operations that may correspond to at least some of the machine-readable instructions of FIGS. 1c-2, 4a-9b and/or other desired operations. The logic gate circuitry 1208 shown in FIG. 12 is fabricated in groups or blocks. Each block includes semiconductor-based electrical structures that may be configured into logic circuits. In some examples, the electrical structures include logic gates (e.g., And gates, Or gates, Nor gates, etc.) that provide basic building blocks for logic circuits. Electrically controllable switches (e.g., transistors) are present within each of the logic gate circuitry 1208 to enable configuration of the electrical structures and/or the logic gates to form circuits to perform desired operations. The logic gate circuitry 1208 may include other electrical structures such as look-up tables (LUTs), registers (e.g., flip-flops or latches), multiplexers, etc.

The interconnections 1210 of the illustrated example are conductive pathways, traces, vias, or the like that may include electrically controllable switches (e.g., transistors) whose state can be changed by programming (e.g., using an HDL instruction language) to activate or deactivate one or more connections between one or more of the logic gate circuitry 1208 to program desired logic circuits.

The storage circuitry 1212 of the illustrated example is structured to store result(s) of the one or more of the operations performed by corresponding logic gates. The storage circuitry 1212 may be implemented by registers or the like. In the illustrated example, the storage circuitry 1212 is distributed amongst the logic gate circuitry 1208 to facilitate access and increase execution speed.

The example FPGA circuitry 1200 of FIG. 12 also includes example Dedicated Operations Circuitry 1214. In this example, the Dedicated Operations Circuitry 1214 includes special purpose circuitry 1216 that may be invoked to implement commonly used functions to avoid the need to program those functions in the field. Examples of such special purpose circuitry 1216 include memory (e.g., DRAM) controller circuitry, PCIe controller circuitry, clock circuitry, transceiver circuitry, memory, and multiplier-accumulator circuitry. Other types of special purpose circuitry may be present. In some examples, the FPGA circuitry 1200 may also include example general purpose programmable circuitry 1218 such as an example CPU 1220 and/or an example DSP 1222. Other general purpose programmable circuitry 1218 may additionally or alternatively be present such as a GPU, an XPU, etc., that can be programmed to perform other operations.

Although FIGS. 11 and 12 illustrate two example implementations of the processor circuitry 1012 of FIG. 10, many other approaches are contemplated. For example, as mentioned above, modern FPGA circuitry may include an onboard CPU, such as one or more of the example CPU 1220 of FIG. 12. Therefore, the processor circuitry 1012 of FIG. 10 may additionally be implemented by combining the example microprocessor 1100 of FIG. 11 and the example FPGA circuitry 1200 of FIG. 12. In some such hybrid examples, a first portion of the machine-readable instructions represented by the flowcharts of FIGS. 4-9 may be executed by one or more of the cores 1102 of FIG. 11 and a second portion of the machine-readable instructions represented by the flowcharts of FIGS. 4-9 may be executed by the FPGA circuitry 1200 of FIG. 12.

In some examples, the processor circuitry 1012 of FIG. 10 may be in one or more packages. For example, the processor circuitry 1100 of FIG. 11 and/or the FPGA circuitry 1200 of FIG. 12 may be in one or more packages. In some examples, an XPU may be implemented by the processor circuitry 1012 of FIG. 10, which may be in one or more packages. For example, the XPU may include a CPU in one package, a DSP in another package, a GPU in yet another package, and an FPGA in still yet another package.

Figure 13:
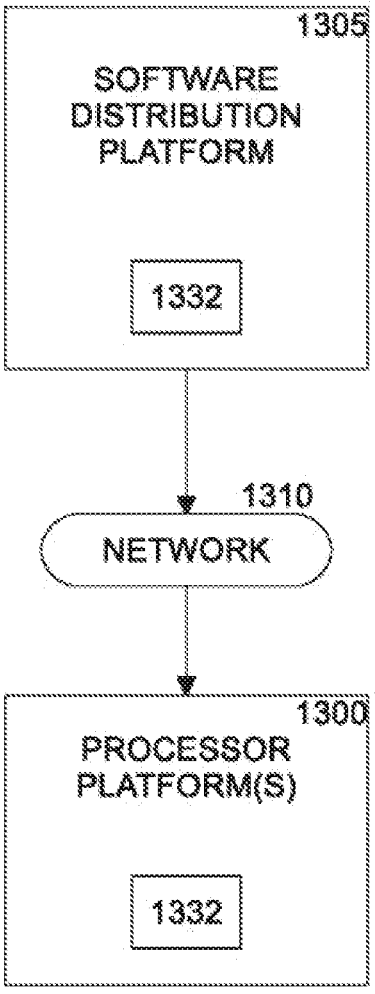
FIG. 13 is a block diagram illustrating an example software distribution platform to distribute software such as the example machine readable instructions of FIG. 10 to hardware devices owned and/or operated by third parties.

A block diagram illustrating an example software distribution platform 1305 to distribute software such as the example machine readable instructions 1032 of FIG. 10 to hardware devices owned and/or operated by third parties is illustrated in FIG. 13. The example software distribution platform 1305 may be implemented by any computer server, data facility, cloud service, etc., capable of storing and transmitting software to other computing devices. The third parties may be customers of the entity owning and/or operating the software distribution platform 1305. For example, the entity that owns and/or operates the software distribution platform 1305 may be a developer, a seller, and/or a licensor of software such as the example machine readable instructions 1032 of FIG. 10. The third parties may be consumers, users, retailers, OEMs, etc., who purchase and/or license the software for use and/or re-sale and/or sub-licensing. In the illustrated example, the software distribution platform 1305 includes one or more servers and one or more storage devices. The storage devices store the machine-readable instructions 1032, which may correspond to the example machine readable instructions, as described above. The one or more servers of the example software distribution platform 1305 are in communication with a network 1310, which may correspond to any one or more of the Internet and/or any of the example networks, etc., described above. In some examples, the one or more servers are responsive to requests to transmit the software to a requesting party as part of a commercial transaction. Payment for the delivery, sale, and/or license of the software may be handled by the one or more servers of the software distribution platform and/or by a third-party payment entity. The servers enable purchasers and/or licensors to download the machine-readable instructions 1032 from the software distribution platform 1305. For example, the software, which may correspond to the example machine readable instructions described above, may be downloaded to the example processor platform 1300, which is to execute the machine-readable instructions 1032 to implement the methods described above and associated computing system 200. In some examples, one or more servers of the software distribution platform 1305 periodically offer, transmit, and/or force updates to the software (e.g., the example machine readable instructions 1032 of FIG. 10) to ensure improvements, patches, updates, etc., are distributed and applied to the software at the end user devices.

In some examples, an apparatus includes means for data processing of FIGS. 1c, 1d, 5a and/or 5b. For example, the means for processing may be implemented by processor circuitry, processor circuitry, firmware circuitry, etc. In some examples, the processor circuitry may be implemented by machine executable instructions executed by processor circuitry, which may be implemented by the example processor circuitry 1012 of FIG. 10, the example processor circuitry 1100 of FIG. 11, and/or the example Field Programmable Gate Array (FPGA) circuitry 1200 of FIG. 12. In other examples, the processor circuitry is implemented by other hardware logic circuitry, hardware implemented state machines, and/or any other combination of hardware, software, and/or firmware. For example, the processor circuitry may be implemented by at least one or more hardware circuits (e.g., processor circuitry, discrete and/or integrated analog and/or digital circuitry, an FPGA, an Application Specific Integrated Circuit (ASIC), a comparator, an operational-amplifier (op-amp), a logic circuit, etc.) structured to perform the corresponding operation without executing software or firmware, but other structures are likewise appropriate.

In the following, some examples are summarized:

An example (e.g., example 1) relates to an apparatus (10) comprising interface circuitry (12) and processor circuitry (14) to write data bits to a memory (102), by applying a diffusion function on the data bits to calculate diffused data bits, calculating error correcting code (ECC) bits based on the data bits or based on the diffused data bits, applying a diffusion function on the ECC bits to calculate diffused ECC bits, storing the diffused ECC bits in an ECC portion of the memory, and storing the data bits or the diffused data bits in a data portion of the memory.

Another example (e.g., example 2) relates to a previously described example (e.g., example 1) or to any of the examples described herein, further comprising that the data bits are encrypted data bits, wherein the processor circuitry is to encrypt unencrypted data bits to obtain the data bits.

Another example (e.g., example 3) relates to a previously described example (e.g., example 2) or to any of the examples described herein, further comprising that the data bits are data bits of a cache line of a processor.

Another example (e.g., example 4) relates to a previously described example (e.g., one of the examples 1 to 3) or to any of the examples described herein, further comprising that the diffusion function is a block-wise function.

Another example (e.g., example 5) relates to a previously described example (e.g., one of the examples 1 to 4) or to any of the examples described herein, further comprising that the diffusion function is a bijective function.

Another example (e.g., example 6) relates to a previously described example (e.g., one of the examples 1 to 5) or to any of the examples described herein, further comprising that the diffusion function is based on at least one secret key.

Another example (e.g., example 7) relates to a previously described example (e.g., example 6) or to any of the examples described herein, further comprising that the diffusion function is a block-wise function, wherein a separate secret key or a separate tweak is used for each block of memory.

Another example (e.g., example 8) relates to a previously described example (e.g., example 6) or to any of the examples described herein, further comprising that a separate secret key is used for each trusted domain of a computer system comprising the apparatus.

Another example (e.g., example 9) relates to a previously described example (e.g., example 8) or to any of the examples described herein, further comprising that the diffusion function is a block-wise function, wherein a separate tweak is used for each block of memory.

Another example (e.g., example 10) relates to a previously described example (e.g., one of the examples 6 to 9) or to any of the examples described herein, further comprising that the processor circuitry is to multiplex between using different keys of a codebook when applying the diffusion function.

Another example (e.g., example 11) relates to a previously described example (e.g., one of the examples 1 to 10) or to any of the examples described herein, further comprising that the processor circuitry is to read data bits from the data portion of a memory by reading diffused ECC bits from the ECC portion of the memory, applying an inverse diffusion function on the diffused ECC bits to obtain ECC bits, obtaining diffused data bits, determining, whether ECC error correction is necessary on the diffused data bits using the ECC bits, in case ECC error correction is necessary, performing ECC error correction on the diffused data bits, and applying the inverse diffusion function on the ECC error-corrected diffused data bits to calculate ECC error corrected data bits, and providing the data bits or the ECC error corrected data bits.

Another example (e.g., example 12) relates to a previously described example (e.g., example 11) or to any of the examples described herein, further comprising that the processor circuitry is to obtain the diffused data bits by reading the diffused data bits from the data portion of the memory.

Another example (e.g., example 13) relates to a previously described example (e.g., example 11) or to any of the examples described herein, further comprising that the processor circuitry is to obtain the diffused data bits by reading the data bits from the data portion of the memory and applying the diffusion function on the data bits.

Another example (e.g., example 14) relates to a previously described example (e.g., one of the examples 11 to 13) or to any of the examples described herein, further comprising that the data bits are encrypted data bits, wherein the processor circuitry is to decrypt the data bits to obtain decrypted data bits.

Another example (e.g., example 15) relates to a previously described example (e.g., example 14) or to any of the examples described herein, further comprising that the processor circuitry is to decrypt a first version of the data bits in parallel to determining, whether ECC error correction is necessary, and to decrypt a second version of the data bits that corresponds to the ECC error corrected data bits in case ECC error correction is necessary.

Another example (e.g., example 16) relates to a previously described example (e.g., example 15) or to any of the examples described herein, further comprising that the second version of the data bits is provided instead of the first version if the ECC error correction is necessary.

Another example (e.g., example 17) relates to a previously described example (e.g., example 15) or to any of the examples described herein, further comprising that the second version of the data bits is provided after the first version if the ECC error correction is necessary.

Another example (e.g., example 18) relates to a previously described example (e.g., one of the examples 1 to 17) or to any of the examples described herein, further comprising that the processor circuitry comprises circuitry to apply the diffusion function and circuitry to apply an inverse diffusion function.

Another example (e.g., example 19) relates to a previously described example (e.g., one of the examples 1 to 18) or to any of the examples described herein, further comprising that the processor circuitry comprises circuitry to calculate the ECC bits, circuitry to determine, whether ECC error correction is necessary, and circuitry to perform ECC error correction.

Another example (e.g., example 20) relates to a previously described example (e.g., one of the examples 1 to 19) or to any of the examples described herein, further comprising that the processor circuitry comprises circuitry to encrypt unencrypted data bits to obtain the data bits, and circuitry to decrypt the data bits.

Another example (e.g., example 21) relates to a previously described example (e.g., one of the examples 1 to 20) or to any of the examples described herein, further comprising that the processor circuitry comprises circuitry to multiplex between using different keys of a codebook when applying the diffusion function or an inverse diffusion function.

An example (e.g., example 22) relates to a memory controller (100) comprising the apparatus according to one of the examples 1 to 21 (or according to any other example).

An example (e.g., example 23) relates to a system (1000) comprising two or more memory controllers (100) according to example 22 (or according to any other example), wherein the diffusion is based on a codebook of secret keys, wherein a different codebook is used by each memory controller.

An example (e.g., example 24) relates to a computer system (1000) comprising the memory controller (100) according to example 22 (or according to any other example), or the system according to example 23 (or according to any other example).

An example (e.g., example 25) relates to an apparatus (10) comprising processor circuitry (14) to write data bits to a memory (102), by applying a diffusion function on the data bits to calculate diffused data bits, calculating error correcting code (ECC) bits based on the data bits or based on the diffused data bits, applying a diffusion function on the ECC bits to calculate diffused ECC bits, storing the diffused ECC bits in an ECC portion of the memory, and storing the data bits or the diffused data bits in a data portion of the memory.

An example (e.g., example 26) relates to a memory controller (100) comprising the apparatus according to example 25 (or according to any other example).

An example (e.g., example 27) relates to a system (1000) comprising two or more memory controllers (100) according to example 26 (or according to any other example), wherein the diffusion is based on a codebook of secret keys, wherein a different codebook is used by each memory controller.

An example (e.g., example 28) relates to a computer system (1000) comprising the memory controller (100) according to example 26 (or according to any other example), or the system according to example 27 (or according to any other example).

An example (e.g., example 29) relates to a device (10) comprising means for processing (14) for writing data bits to a memory (102), by applying a diffusion function on the data bits to calculate diffused data bits, calculating error correcting code (ECC) bits based on the data bits or based on the diffused data bits, applying a diffusion function on the ECC bits to calculate diffused ECC bits, storing the diffused ECC bits in an ECC portion of the memory, and storing the data bits or the diffused data bits in a data portion of the memory.

An example (e.g., example 30) relates to a memory controller (100) comprising the device according to example 29 (or according to any other example).

An example (e.g., example 31) relates to a system (1000) comprising two or more memory controllers (100) according to example 30 (or according to any other example), wherein the diffusion is based on a codebook of secret keys, wherein a different codebook is used by each memory controller.

An example (e.g., example 32) relates to a computer system (1000) comprising the memory controller (100) according to example 30 (or according to any other example), or the system according to example 31 (or according to any other example).

An example (e.g., example 33) relates to a method comprising writing (131-135) data bits to a memory (102), by applying (131) a diffusion function on the data bits to calculate diffused data bits, calculating (132) error correcting code (ECC) bits based on the data bits or based on the diffused data bits, applying (133) a diffusion function on the ECC bits to calculate diffused ECC bits, storing (134) the diffused ECC bits in an ECC portion of the memory, and storing (135) the data bits or the diffused data bits in a data portion of the memory.

Another example (e.g., example 34) relates to a previously described example (e.g., example 33) or to any of the examples described herein, further comprising that the data bits are encrypted data bits, wherein the method comprises encrypting (120) unencrypted data bits to obtain the data bits.

Another example (e.g., example 35) relates to a previously described example (e.g., example 34) or to any of the examples described herein, further comprising that the data bits are data bits of a cache line of a processor.

Another example (e.g., example 36) relates to a previously described example (e.g., one of the examples 33 to 35) or to any of the examples described herein, further comprising that the diffusion function is a block-wise function.

Another example (e.g., example 37) relates to a previously described example (e.g., one of the examples 33 to 36) or to any of the examples described herein, further comprising that the diffusion function is a bijective function.

Another example (e.g., example 38) relates to a previously described example (e.g., one of the examples 33 to 37) or to any of the examples described herein, further comprising that the diffusion function is based on at least one secret key.

Another example (e.g., example 39) relates to a previously described example (e.g., example 38) or to any of the examples described herein, further comprising that the diffusion function is a block-wise function, wherein a separate secret key or a separate tweak is used for each block of memory.

Another example (e.g., example 40) relates to a previously described example (e.g., example 38) or to any of the examples described herein, further comprising that a separate secret key is used for each trusted domain of a computer system comprising the method.

Another example (e.g., example 41) relates to a previously described example (e.g., example 40) or to any of the examples described herein, further comprising that the diffusion function is a block-wise function, wherein a separate tweak is used for each block of memory.

Another example (e.g., example 42) relates to a previously described example (e.g., one of the examples 38 to 41) or to any of the examples described herein, further comprising that the method comprising multiplexing (110) between using different keys of a codebook when applying the diffusion function.

Another example (e.g., example 43) relates to a previously described example (e.g., one of the examples 33 to 42) or to any of the examples described herein, further comprising that the method comprises reading (141-148) data bits from the data portion of a memory by reading (141) diffused ECC bits from the ECC portion of the memory, applying (142) an inverse diffusion function on the diffused ECC bits to obtain ECC bits, obtaining (143) diffused data bits, determining (144), whether ECC error correction is necessary on the diffused data bits using the ECC bits, in case ECC error correction is necessary, performing (145) ECC error correction on the diffused data bits, and applying (146) the inverse diffusion function on the ECC error-corrected diffused data bits to calculate ECC error corrected data bits, and providing (148) the data bits or the ECC error corrected data bits.

Another example (e.g., example 44) relates to a previously described example (e.g., example 43) or to any of the examples described herein, further comprising that the method comprises obtaining the diffused data bits by reading (143a) the diffused data bits from the data portion of the memory.

Another example (e.g., example 45) relates to a previously described example (e.g., example 43) or to any of the examples described herein, further comprising that the method comprises obtaining the diffused data bits by reading (143b) the data bits from the data portion of the memory and applying (143c) the diffusion function on the data bits.

Another example (e.g., example 46) relates to a previously described example (e.g., one of the examples 43 to 45) or to any of the examples described herein, further comprising that the data bits are encrypted data bits, wherein the method comprises decrypting (150) the data bits to obtain decrypted data bits.

Another example (e.g., example 47) relates to a previously described example (e.g., example 46) or to any of the examples described herein, further comprising that the method comprises decrypting (150) a first version of the data bits in parallel to determining, whether ECC error correction is necessary, and decrypting (150) a second version of the data bits that corresponds to the ECC error corrected data bits in case ECC error correction is necessary.

Another example (e.g., example 48) relates to a previously described example (e.g., example 47) or to any of the examples described herein, further comprising that the second version of the data bits is provided instead of the first version if the ECC error correction is necessary.

Another example (e.g., example 49) relates to a previously described example (e.g., example 47) or to any of the examples described herein, further comprising that the second version of the data bits is provided after the first version if the ECC error correction is necessary.

Another example (e.g., example 50) relates to a previously described example (e.g., one of the examples 33 to 49) or to any of the examples described herein, further comprising that the method uses circuitry to apply the diffusion function and circuitry to apply an inverse diffusion function.

Another example (e.g., example 51) relates to a previously described example (e.g., one of the examples 33 to 50) or to any of the examples described herein, further comprising that the method uses circuitry to calculate the ECC bits, circuitry to determine, whether ECC error correction is necessary, and circuitry to perform ECC error correction.

Another example (e.g., example 52) relates to a previously described example (e.g., one of the examples 33 to 51) or to any of the examples described herein, further comprising that method uses circuitry to encrypt unencrypted data bits to obtain the data bits, and circuitry to decrypt the data bits.

Another example (e.g., example 53) relates to a previously described example (e.g., one of the examples 33 to 52) or to any of the examples described herein, further comprising that the method uses circuitry to multiplex between using different keys of a codebook when applying the diffusion function or an inverse diffusion function.

An example (e.g., example 54) relates to a memory controller (100) being configured to perform the method according to one of the examples 33 to 53 (or according to any other example).

An example (e.g., example 55) relates to a system (1000) comprising two or more memory controllers (100) according to example 54 (or according to any other example), wherein the diffusion is based on a codebook of secret keys, wherein a different codebook is used by each memory controller.

An example (e.g., example 56) relates to a computer system (1000) comprising the memory controller (100)

according to example 54 (or according to any other example), or the system according to example 55 (or according to any other example).

An example (e.g., example 57) relates to a non-transitory machine-readable storage medium including program code, when executed, to cause a machine to perform the method of one of the examples 33 to 53 (or according to any other example).

An example (e.g., example 58) relates to a computer program having a program code for performing the method one of the examples 33 to 53 (or according to any other example) when the computer program is executed on a computer, a processor, or a programmable hardware component.

An example (e.g., example 59) relates to a machine-readable storage including machine readable instructions, when executed, to implement a method or realize an apparatus as claimed in any pending claim or shown in any example.

From the foregoing, it will be appreciated that example systems, methods, apparatus, and articles of manufacture have been disclosed that provide improved row hammer attack mitigation. The disclosed systems, methods, apparatus, and articles of manufacture improve the security of using a computing device by improving mitigation methods of responding to row hammer attacks. The disclosed systems, methods, apparatus, and articles of manufacture are accordingly directed to one or more improvement(s) in the operation of a machine such as a computer or other electronic and/or mechanical device.

Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the examples of this patent.

Some aspects of the present disclosure relate to a method comprising reading a plurality of encrypted data bits and a plurality of error correcting code (ECC) bits from a memory, applying a diffusion function to the plurality of encrypted data bits and to the plurality of ECC bits to produce diffused encrypted data bits and diffused ECC bits, applying an ECC to the diffused encrypted data bits and the diffused ECC bits to detect an error, and decrypting the diffused encrypted data bits.

The aspects and features described in relation to a particular one of the previous examples may also be combined with one or more of the further examples to replace an identical or similar feature of that further example or to additionally introduce the features into the further example.

Examples may further be or relate to a (computer) program including a program code to execute one or more of the above methods when the program is executed on a computer, processor, or other programmable hardware component. Thus, steps, operations, or processes of different ones of the methods described above may also be executed by programmed computers, processors, or other programmable hardware components. Examples may also cover program storage devices, such as digital data storage media, which are machine-, processor- or computer-readable and encode and/or contain machine-executable, processor-executable or computer-executable programs and instructions. Program storage devices may include or be digital storage devices, magnetic storage media such as magnetic disks and magnetic tapes, hard disk drives, or optically readable digital data storage media, for example. Other examples may also include computers, processors, control units, (field) programmable logic arrays ((F)PLAs), (field) programmable gate arrays ((F)PGAs), graphics processor units (GPU), application-specific integrated circuits (ASICs), integrated circuits (ICs) or system-on-a-chip (SoCs) systems programmed to execute the steps of the methods described above.

It is further understood that the disclosure of several steps, processes, operations, or functions disclosed in the description or claims shall not be construed to imply that these operations are necessarily dependent on the order described, unless explicitly stated in the individual case or necessary for technical reasons. Therefore, the previous description does not limit the execution of several steps or functions to a certain order. Furthermore, in further examples, a single step, function, process, or operation may include and/or be broken up into several sub-steps, -functions, -processes or -operations.

If some aspects have been described in relation to a device or system, these aspects should also be understood as a description of the corresponding method. For example, a block, device or functional aspect of the device or system may correspond to a feature, such as a method step, of the corresponding method. Accordingly, aspects described in relation to a method shall also be understood as a description of a corresponding block, a corresponding element, a property or a functional feature of a corresponding device or a corresponding system.

As used herein, the term "module" refers to logic that may be implemented in a hardware component or device, software or firmware running on a processing unit, or a combination thereof, to perform one or more operations consistent with the present disclosure. Software and firmware may be embodied as instructions and/or data stored on non-transitory computer-readable storage media. As used herein, the term "circuitry" can comprise, singly or in any combination, non-programmable (hardwired) circuitry, programmable circuitry such as processing units, state machine circuitry, and/or firmware that stores instructions executable by programmable circuitry. Modules described herein may, collectively or individually, be embodied as circuitry that forms a part of a computing system. Thus, any of the modules can be implemented as circuitry. A computing system referred to as being programmed to perform a method can be programmed to perform the method via software, hardware, firmware, or combinations thereof.

Any of the disclosed methods (or a portion thereof) can be implemented as computer-executable instructions or a computer program product. Such instructions can cause a computing system or one or more processing units capable of executing computer-executable instructions to perform any of the disclosed methods. As used herein, the term "computer" refers to any computing system or device described or mentioned herein. Thus, the term "computer-executable instruction" refers to instructions that can be executed by any computing system or device described or mentioned herein.

The computer-executable instructions can be part of, for example, an operating system of the computing system, an application stored locally to the computing system, or a remote application accessible to the computing system (e.g., via a web browser). Any of the methods described herein can be performed by computer-executable instructions performed by a single computing system or by one or more networked computing systems operating in a network environment. Computer-executable instructions and updates to the computer-executable instructions can be downloaded to a computing system from a remote server.

Further, it is to be understood that implementation of the disclosed technologies is not limited to any specific computer language or program. For instance, the disclosed technologies can be implemented by software written in C++, C #, Java, Perl, Python, JavaScript, Adobe Flash, C #, assembly language, or any other programming language. Likewise, the disclosed technologies are not limited to any particular computer system or type of hardware.

Furthermore, any of the software-based examples (comprising, for example, computer-executable instructions for causing a computer to perform any of the disclosed methods) can be uploaded, downloaded, or remotely accessed through a suitable communication means. Such suitable communication means include, for example, the Internet, the World Wide Web, an intranet, cable (including fiber optic cable), magnetic communications, electromagnetic communications (including RF, microwave, ultrasonic, and infrared communications), electronic communications, or other such communication means.

The disclosed methods, apparatuses, and systems are not to be construed as limiting in any way. Instead, the present disclosure is directed toward all novel and nonobvious features and aspects of the various disclosed examples, alone and in various combinations and subcombinations with one another. The disclosed methods, apparatuses, and systems are not limited to any specific aspect or feature or combination thereof, nor do the disclosed examples require that any one or more specific advantages be present, or problems be solved.

Theories of operation, scientific principles, or other theoretical descriptions presented herein in reference to the apparatuses or methods of this disclosure have been provided for the purposes of better understanding and are not intended to be limiting in scope. The apparatuses and methods in the appended claims are not limited to those apparatuses and methods that function in the manner described by such theories of operation.

The following claims are hereby incorporated in the detailed description, wherein each claim may stand on its own as a separate example. It should also be noted that although in the claims a dependent claim refers to a particular combination with one or more other claims, other examples may also include a combination of the dependent claim with the subject matter of any other dependent or independent claim. Such combinations are hereby explicitly proposed, unless it is stated in the individual case that a particular combination is not intended. Furthermore, features of a claim should also be included for any other independent claim, even if that claim is not directly defined as dependent on that other independent claim.

What is claimed is:

1. An apparatus comprising interface circuitry and processor circuitry to:
 encrypt unencrypted data bits to obtain encrypted data bits;
 write the encrypted data bits to a memory, by:
 applying a diffusion function on the encrypted data bits to calculate diffused data bits,
 calculating error correcting code (ECC) bits based on the encrypted data bits or based on the diffused data bits,
 applying a diffusion function on the ECC bits to calculate diffused ECC bits,
 storing the diffused ECC bits in an ECC portion of the memory, and
 storing the encrypted data bits or the diffused data bits in a data portion of the memory.

2. The apparatus according to claim 1, wherein the encrypted data bits are data bits of a cache line of a processor.

3. The apparatus according to claim 1, wherein the diffusion function is a block-wise function.

4. The apparatus according to claim 1, wherein the diffusion function is a bijective function.

5. The apparatus according to claim 1, wherein the diffusion function is based on at least one secret key.

6. The apparatus according to claim 5, wherein the diffusion function is a block-wise function, wherein a separate secret key or a separate tweak is used for each block of memory.

7. The apparatus according to claim 5, wherein a separate secret key is used for each trusted domain of a computer system comprising the apparatus.

8. The apparatus according to claim 7, wherein the diffusion function is a block-wise function, wherein a separate tweak is used for each block of memory.

9. The apparatus according to claim 5, wherein the processor circuitry is to multiplex between using different keys of a codebook when applying the diffusion function.

10. The apparatus according to claim 1, wherein the processor circuitry is to read the encrypted data bits from the data portion of a memory by:
 reading diffused ECC bits from the ECC portion of the memory,
 applying an inverse diffusion function on the diffused ECC bits to obtain ECC bits,
 obtaining diffused data bits,
 determining, whether ECC error correction is necessary on the diffused data bits using the ECC bits,
 in case ECC error correction is necessary, performing ECC error correction on the diffused data bits, and applying the inverse diffusion function on the ECC error-corrected diffused data bits to calculate ECC error corrected data bits, and
 providing the encrypted data bits or the ECC error corrected data bits.

11. The apparatus according to claim 10, wherein the processor circuitry is to obtain the diffused data bits by reading the diffused data bits from the data portion of the memory.

12. The apparatus according to claim 10, wherein the processor circuitry is to obtain the diffused data bits by reading the data bits from the data portion of the memory and applying the diffusion function on the data bits.

13. The apparatus according to claim 10, wherein the data bits are encrypted data bits, wherein the processor circuitry is to decrypt the data bits to obtain decrypted data bits.

14. The apparatus according to claim 13, wherein the processor circuitry is to decrypt a first version of the data bits in parallel to determining, whether ECC error correction is necessary, and to decrypt a second version of the data bits that corresponds to the ECC error corrected data bits in case ECC error correction is necessary.

15. The apparatus according to claim 14, wherein the second version of the data bits is provided instead of the first version if the ECC error correction is necessary.

16. A memory controller comprising the apparatus according to claim 1.

17. A system comprising two or more memory controllers according to claim 16,
 wherein the diffusion is based on a codebook of secret keys, wherein a different codebook is used by each memory controller.

18. A method comprising:

encrypting unencrypted data bits to obtain encrypted data bits;

writing the encrypted data bits to a memory, by:

applying a diffusion function on the encrypted data bits to calculate diffused data bits, calculating error correcting code (ECC) bits based on the encrypted data bits or based on the diffused data bits, applying a diffusion function on the ECC bits to calculate diffused ECC bits, storing the diffused ECC bits in an ECC portion of the memory, and storing the encrypted data bits or the diffused data bits in a data portion of the memory.

19. A non-transitory machine-readable storage medium including program code which, when executed by a processor, causes the processor to perform the method of claim 18.

\*    \*    \*    \*    \*